(12) United States Patent
Ono et al.

(10) Patent No.: US 8,120,751 B2
(45) Date of Patent: Feb. 21, 2012

(54) COUPLING APPARATUS, EXPOSURE APPARATUS, AND DEVICE FABRICATING METHOD

(75) Inventors: Kazuya Ono, Saitama (JP); Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 26 days.

(21) Appl. No.: 12/585,498

(22) Filed: Sep. 16, 2009

(65) Prior Publication Data

US 2010/0007865 A1 Jan. 14, 2010

Related U.S. Application Data

(60) Division of application No. 11/322,125, filed on Dec. 30, 2005, now Pat. No. 7,619,715, which is a continuation of application No. PCT/JP2004/010059, filed on Jul. 8, 2004.

(30) Foreign Application Priority Data

Jul. 9, 2003 (JP) ................................. 2003-272615
Jul. 28, 2003 (JP) ................................. 2003-281182

(51) Int. Cl.
*G03B 27/42* (2006.01)
*G03B 27/52* (2006.01)
(52) U.S. Cl. .......................................... 355/53; 355/30
(58) Field of Classification Search .................... 355/30, 355/52, 53, 77
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,528,118 A | 6/1996 | Lee | |
| 5,610,683 A * | 3/1997 | Takahashi | 355/53 |
| 5,623,853 A | 4/1997 | Novak et al. | |
| 5,677,757 A | 10/1997 | Taniguchi et al. | |
| 5,715,039 A | 2/1998 | Fukuda et al. | |
| 5,825,043 A | 10/1998 | Suwa | |
| 5,874,820 A | 2/1999 | Lee | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,437,354 B1 | 8/2002 | Nara et al. | |
| 6,485,153 B2 * | 11/2002 | Ota | 359/859 |
| 6,529,264 B1 | 3/2003 | Ikeda | |

(Continued)

FOREIGN PATENT DOCUMENTS

CN 1501170 A 6/2004

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.

(Continued)

*Primary Examiner* — Hung Henry Nguyen
(74) *Attorney, Agent, or Firm* — Oliff & Berridge, PLC

(57) ABSTRACT

An exposure apparatus fills a space between a projection optical system and a substrate with a liquid and projects a pattern image onto the substrate to expose the substrate. The projection optical system has a first group including an optical member that comes into contact with the liquid, and a second group that differs from the first group. The first group is supported by a first support member via a vibration isolating apparatus.

50 Claims, 14 Drawing Sheets

U.S. PATENT DOCUMENTS

| | | |
|---|---|---|
| 6,549,269 B1 | 4/2003 | Nishi et al. |
| 6,590,634 B1 | 7/2003 | Nishi et al. |
| 6,639,740 B1 | 10/2003 | Spinali |
| 6,757,051 B2 | 6/2004 | Takahashi et al. |
| 6,853,443 B2 | 2/2005 | Nishi |
| 6,930,842 B2 | 8/2005 | Shibazaki |
| 6,940,582 B1 | 9/2005 | Tanaka |
| 7,154,684 B2 | 12/2006 | Shibazaki |
| 7,483,118 B2 | 1/2009 | Mulkens |
| 7,619,715 B2 * | 11/2009 | Ono et al. .................. 355/53 |
| 2001/0008440 A1 | 7/2001 | Hummel et al. |
| 2001/0010579 A1 | 8/2001 | Nishi |
| 2002/0008863 A1 | 1/2002 | Taniguchi et al. |
| 2002/0044260 A1 | 4/2002 | Takahashi et al. |
| 2002/0075574 A1 | 6/2002 | Sorg et al. |
| 2002/0080339 A1 | 6/2002 | Takahashi |
| 2002/0085192 A1 | 7/2002 | Miura et al. |
| 2002/0104453 A1 | 8/2002 | Lee et al. |
| 2002/0109437 A1 | 8/2002 | Sorg et al. |
| 2002/0163629 A1 | 11/2002 | Switkes et al. |
| 2002/0167652 A1 | 11/2002 | Ueyama |
| 2003/0030916 A1 | 2/2003 | Suenaga |
| 2003/0058426 A1 | 3/2003 | Watson et al. |
| 2003/0174408 A1 | 9/2003 | Rostalski et al. |
| 2003/0210383 A1 | 11/2003 | Bjorklund et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2004/0263812 A1 | 12/2004 | Hummel et al. |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0098180 A1 | 5/2006 | Bleeker |
| 2006/0187430 A1 | 8/2006 | Dodoc et al. |

FOREIGN PATENT DOCUMENTS

| | | |
|---|---|---|
| DE | 221 563 A1 | 4/1985 |
| DE | 224 448 A1 | 7/1985 |
| EP | 0 605 103 B1 | 10/1998 |
| EP | 1 137 054 A1 | 9/2001 |
| EP | 1 211 560 A1 | 6/2002 |
| EP | 1220 012 A2 | 7/2002 |
| EP | 1 321 822 A1 | 6/2003 |
| EP | 1 369 745 A1 | 12/2003 |
| EP | 1 420 302 A1 | 5/2004 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-04-305915 | 10/1992 |
| JP | A-04-305917 | 10/1992 |
| JP | A-4-305917 | 10/1992 |
| JP | A-05-62877 | 3/1993 |
| JP | A-5-62877 | 3/1993 |
| JP | A-6-124873 | 5/1994 |
| JP | A-06-124873 | 5/1994 |
| JP | A-06-168866 | 6/1994 |
| JP | A-6-168866 | 6/1994 |
| JP | A-7-220990 | 8/1995 |
| JP | A-07-220990 | 8/1995 |
| JP | A-08-166475 | 6/1996 |
| JP | A-8-166475 | 6/1996 |
| JP | A-08-316125 | 11/1996 |
| JP | A-8-316125 | 11/1996 |
| JP | A-8-330224 | 12/1996 |
| JP | A-08-330224 | 12/1996 |
| JP | A-10-163099 | 6/1998 |
| JP | A-10-214783 | 8/1998 |
| JP | A-10-228661 | 8/1998 |
| JP | A-10-255319 | 9/1998 |
| JP | A-10-303114 | 11/1998 |
| JP | A-10-340846 | 12/1998 |

| | | |
|---|---|---|
| JP | A-11-176727 | 7/1999 |
| JP | A-11-288870 | 10/1999 |
| JP | A-2000-58436 | 2/2000 |
| JP | A-2000-505958 | 5/2000 |
| JP | A-2002-083766 | 3/2002 |
| JP | A-2002-170765 | 6/2002 |
| TW | 396395 | 12/1987 |
| WO | WO 98/24115 | 6/1998 |
| WO | WO 99/49504 A1 | 9/1999 |
| WO | WO 01/22480 A1 | 3/2001 |
| WO | WO 02/16993 A1 | 2/2002 |
| WO | WO 02/091078 A1 | 11/2002 |
| WO | WO 03/052511 A2 | 6/2003 |
| WO | WO 03/077036 A1 | 9/2003 |
| WO | WO 03/077037 A1 | 9/2003 |
| WO | WO 2004/019128 A2 | 3/2004 |
| WO | WO 2004/107048 A2 | 5/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/107048 A2 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, $3^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Apr. 12, 2011 Decision of Dismissal of Amendment issued in JP Application No. 2005-511581 (with English translation).

Feb. 9, 2007 Office Action in U.S. Appl. No. 11/322,125.

Oct. 12, 2007 Notice of Allowance in U.S. Appl. No. 11/322,125.

Dec. 27, 2007 Office Action in U.S. Appl. No. 11/322,125.

Apr. 23, 2008 Office Action in U.S. Appl. No. 11/322,125.

Dec. 24, 2008 Office Action in U.S. Appl. No. 11/322,125.

Jun. 17, 2009 Notice of Allowance in U.S. Appl. No. 11/322,125.

Feb. 9, 2007 Office Action in U.S. Appl. No. 11/350,937.

Nov. 5, 2007 Notice of Allowance in U.S. Appl. No. 11/350,937.

May 20, 2010 Office Action in U.S. Appl. No. 12/068,323.

Jan. 14, 2011 Office Action in U.S. Appl. No. 12/068,323.

Oct. 26, 2004 International Search Report in International Application No. PCT/JP2004/010059, with translation.

Oct. 26, 2004 Written Opinion in International Application No. PCT/JP2004/010059, with translation.

Apr. 20, 2010 Office Action in Japanese Application No. 2005-511581, with translation.

Oct. 19, 2010 Office Action in Japanese Application No. 2005-511581, with translation.

Nov. 9, 2007 Office Action in Chinese Application No. 200480023880.9, with translation.

Aug. 22, 2008 Office Action in Chinese Application No. 200480023880.9, with translation.

Nov. 30, 2010 Office Action in Chinese Application No. 200910140881.6, with translation.

Mar. 27, 2008 Supplementary European Search Report in European Application No. 04747525.6.

Jul. 21, 2008 Office Action in European Application No. 04747525.6.

Mar. 19, 2009 Office Action in European Application No. 04747525.6.

Apr. 27, 2010 Communication under Rule 71(3) EPC in European Application No. 04747525.6.

Oct. 6, 2010 Office Action in Taiwanese Application No. 093120551, with translation.

Feb. 25, 2011 Office Action in Taiwanese Application No. 093120551, with translation.

Feb. 17, 2011 Office Action in Korean Application No. 10-2005-7024635, with translation.

Apr. 12, 2011 Office Action in Japanese Application No. 2005-511581, with translation.

Sep. 27, 2011 Office Action issued in U.S. Appl. No. 12/068,323.

Sep. 2, 2011 Notice of Opposition issued in EP Application No. 04747525.6 (with English translation).

* cited by examiner

US 8,120,751 B2

COUPLING APPARATUS, EXPOSURE APPARATUS, AND DEVICE FABRICATING METHOD

CROSS-REFERENCE TO RELATED APPLICATIONS

This is a Division of application Ser. No. 11/322,125 filed Dec. 30, 2005 (now U.S. Pat. No. 7,619,715), which in turn is a Continuation of International Application No. PCT/JP2004/010059, filed Jul. 8, 2004, which claims priority to Japanese Patent Application Nos. 2003-272615 (filed on Jul. 9, 2003) and 2003-281182 (filed on Jul. 28, 2003). The disclosures of the aforementioned applications are incorporated herein by reference in their entireties.

BACKGROUND OF THE INVENTION

1. Field of the Invention

The present invention relates to a coupling apparatus that couples two objects, an exposure apparatus that exposes a substrate via a projection optical system in a state wherein a liquid is filled between the projection optical system and the substrate, and a device fabricating method that uses the exposure apparatus.

2. Description of Related Art

Semiconductor devices and liquid crystal display devices are fabricated by a so-called photolithography technique, wherein a pattern formed on a mask is transferred onto a photosensitive substrate. An exposure apparatus used by this photolithographic process comprises a mask stage that supports the mask, and a substrate stage that supports the substrate, and transfers the pattern of the mask onto the substrate via a projection optical system while successively moving the mask stage and the substrate stage. There has been demand in recent years for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the currently mainstream exposure wavelength is the 248 nm KrF excimer laser, but an even shorter wavelength 193 nm ArF excimer laser is also being commercialized. In addition, the depth of focus (DOF) is also important as well as the resolution when performing an exposure. The following equations respectively express the resolution R and the depth of focus $\delta$.

$$R = k_1 \cdot \lambda / NA, \quad (1)$$

$$\delta = \pm k_2 \cdot \lambda / NA^2, \quad (2)$$

Therein, $\lambda$ is the exposure wavelength, NA is the numerical aperture of the projection optical system, and $k_1$ and $k_2$ are the process coefficients. Equations (1) and (2) teach that shortening the exposure wavelength $\lambda$ increases the resolution R, and that increasing the numerical aperture NA decreases the depth of focus $\delta$.

If the depth of focus $\delta$ becomes excessively small, then it will become difficult to align the surface of the substrate with the image plane of the projection optical system, and there will be a risk of insufficient margin of focus during the exposure operation. Accordingly, a liquid immersion method has been proposed, as disclosed in, for example, PCT International Publication No. WO99/49504 (Patent Document 1), as a method to substantially shorten the exposure wavelength and increase the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times. Furthermore, the contents of the above-mentioned Patent Document 1 are hereby incorporated by reference in its entirety to the extent permitted by the laws or regulations of the states designated or elected by the present international patent application.

Incidentally, there is a possibility that vibrations produced by the movement of the substrate stage that holds the substrate, and the like, in the state wherein the liquid is filled between the end surface (the terminal end surface) of the optical member on the most substrate side of the projection optical system and the substrate surface, will transmit to the optical member of the terminal end thereof via the liquid, and that the pattern image projected onto the substrate via the projection optical system and the liquid will unfortunately degrade. In addition, there is a possibility that changes in the pressure of that liquid will apply force to the projection optical system, and will fluctuate the projection optical system, and unfortunately degrade the pattern image projected onto the substrate.

SUMMARY OF THE INVENTION

The present invention was created considering such circumstances, and has a first object to provide an apparatus that couples two objects so that the vibration of one object does not transmit to the other object. In addition, the present invention has a second object to provide an exposure apparatus that can suppress the degradation of the pattern image when filling a liquid between a projection optical system and a substrate and performing an exposure, and a device fabricating method that uses this exposure apparatus.

The first aspect of the present invention is an exposure apparatus that exposes a substrate by filling a liquid between a projection optical system and the substrate, and projecting a pattern image onto the substrate via the projection optical system and the liquid, wherein: the projection optical system includes a first group having an optical member that contacts the liquid, and a second group that differs from the first group; the first group is supported by a first support member; and the second group is separated from the first group and is supported by a second support member that is different from the first support member.

According to the present aspect, because, of the projection optical system, the first group including the optical member that contacts the liquid and the second group different therefrom are isolated and respectively supported by the first support member and the second support member, the first group and the second group can be vibrationally isolated. Accordingly, it is possible to prevent the transmission of vibrations from the first group to the second group, to prevent degradation of the pattern image, and to manufacture a device with high pattern accuracy.

The second aspect of the present invention is an exposure apparatus that exposes a substrate by filling a liquid between a projection optical system and the substrate and projecting a pattern image onto the substrate via the projection optical system and the liquid, wherein: the projection optical system includes a first group has an optical member that contacts the liquid, and a second group that is different from the first group; and a drive mechanism, which moves the first group, adjusts the position of the first group with respect to the second group.

According to the present aspect, because, of the projection optical system, the first group including the optical member that contacts the liquid can be positioned at a desired position with respect to the second group different from the first group, it is possible to prevent degradation of the pattern image, and to manufacture a high-precision device, even if liquid is filled between the projection optical system and the substrate.

The third aspect of the present invention is a coupling apparatus that couples a first object and a second object, including: a parallel link mechanism that couples the first object and the second object; and a vibration isolating mechanism that is built in the parallel link mechanism so that vibrations of one of the first object and the second object do not transmit to the other.

According to the present aspect, by coupling the first object and the second object using the parallel link mechanism in which the vibration isolating mechanism is built, it is possible to prevent the transmission of the vibrations (fluctuations) of the one object to the other object. In addition, by driving the parallel link mechanism, it is possible to maintain and adjust the relative position between the first object and the second object.

The fourth aspect of the present invention is an exposure apparatus that exposes a substrate by filling a liquid in at least one part between a projection optical system and the substrate, and projecting a pattern image onto the substrate via the projection optical system and the liquid, wherein: the projection optical system includes a first group having at least an optical member that contacts the liquid, and a second group disposed between the first group and the pattern; and the exposure apparatus includes: a first holding member that holds the first group; a second holding member that holds the second group isolated from the first holding member; and a frame member that supports the first holding member and the second holding member.

According to the present aspect, because the first group including the optical member that contacts the liquid and the second group different therefrom are isolated and respectively supported by the first holding member and the second holding member, it is possible to vibrationally isolate the first group and the second group. Accordingly, it is possible to prevent the transmission of vibrations, caused by the liquid, from the first holding member holding the first group to the second holding member holding the second group, to prevent degradation of the pattern image, and to manufacture a device with high pattern accuracy.

In addition, if, for example, the reference mirror (fixed mirror) of the interferometer system for measuring the position information of the substrate stage is affixed to the second holding member, by preventing the transmission of the vibrations to the second holding member, the measurement of the position information of the substrate stage and the position control of the substrate stage based on that measurement result can be performed with good accuracy.

The fifth aspect of the present invention is an exposure apparatus that exposes a substrate by irradiating the substrate with an exposure light via a projection optical system and a liquid, wherein: the projection optical system includes a first group having an optical member that contacts the liquid, and a second group disposed between the first group and a pattern; and the exposure apparatus includes: a first holding member that holds the first group; a second holding member that holds the second group isolated from the first holding member; a frame member for supporting the first holding member; and a linking mechanism including a vibration isolating mechanism for controlling the vibrations of at least one of the first holding member and the frame member, and that links the first holding member and the frame member.

According to the present aspect, because the first group including the optical member that contacts the liquid and the second group different therefrom are isolated and respectively supported by the first holding member and the second holding member, it is possible to vibrationally isolate the first group and the second group. Accordingly, it is possible to prevent the transmission of vibrations, caused by, for example, the liquid, from the first holding member holding the first group to the second holding member holding the second group, to prevent degradation of the pattern image, and to manufacture a device with high pattern accuracy.

The sixth aspect of the present invention is an exposure apparatus that exposes a substrate by irradiating the substrate with an exposure light via a projection optical system and a liquid, including: a liquid immersion mechanism that forms an immersion area at only one part on the substrate during exposure of the substrate; wherein, the projection optical system includes a first group having an optical member that contacts the liquid, and a second group disposed between the first group and a pattern; and the first group and the second group are supported vibrationally isolated.

According to the present aspect, because the first group including the optical member that contacts the liquid and the second group different therefrom are supported vibrationally isolated, it is possible to prevent the transmission of vibrations, caused by, for example, the liquid, from the first group to the second group, to prevent degradation of the pattern image, and to manufacture a device with high pattern accuracy.

In addition, the seventh aspect of the present invention is a device fabricating method, wherein an exposure apparatus as recited above is used.

DETAILED DESCRIPTION OF THE INVENTION

The following explains the exposure apparatus and a device fabricating method of the present invention, referencing the drawings. However, the present invention is not limited to the embodiments below; for example, the constituent elements of these embodiments may be suitably combined.

(First Embodiment of the Exposure Apparatus)

Figure 1:
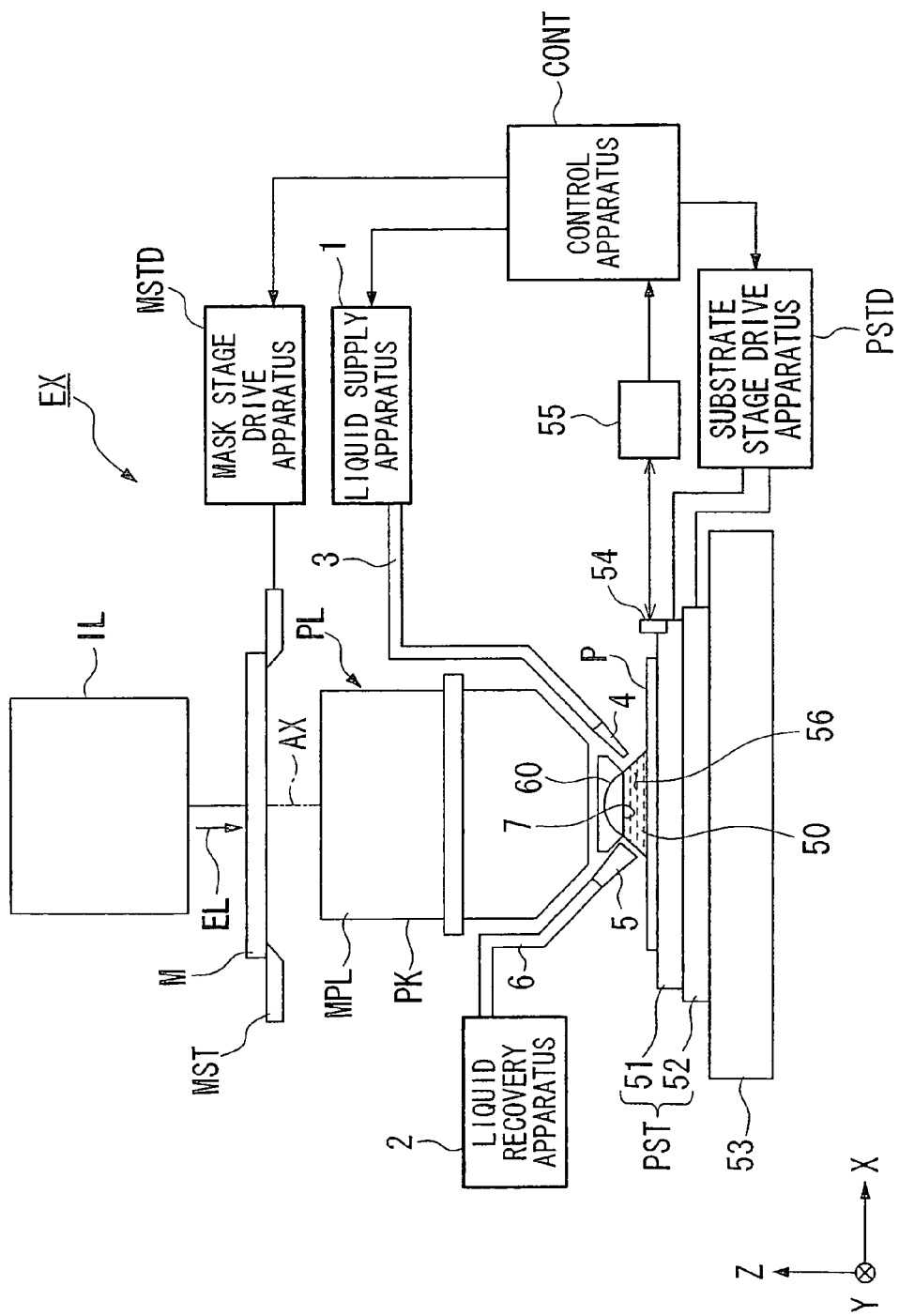
FIG. 1 is a schematic block diagram showing the first embodiment of an exposure apparatus of the present invention.

FIG. 1 is a schematic block diagram that depicts the first embodiment of the exposure apparatus according to the present invention.

In FIG. 1, the exposure apparatus EX includes a mask stage MST that supports a mask M; a substrate stage PST that supports a substrate P; an illumination optical system IL that illuminates with an exposure light EL the mask M supported by the mask stage MST; a projection optical system PL that projects and exposes an image of a pattern of the mask M illuminated by the exposure light EL onto the substrate P supported by the substrate stage PST; and a control apparatus CONT that collectively controls the overall operation of the exposure apparatus EX.

Here, as an example, the present embodiment explains a case of using, as the exposure apparatus EX, a scanning type exposure apparatus (a so-called scanning stepper) that, while synchronously moving the mask M and the substrate P in mutually different directions (opposite directions) in the scanning direction, exposes the substrate P with the pattern formed on the mask M. In the following explanation, the direction that coincides with an optical axis AX of the projection optical system PL is the Z axial direction, the direction in which the mask M and the substrate P synchronously move in the plane perpendicular to the Z axial direction (the scanning direction) is the X axial direction, and the direction perpendicular to the Z axial direction and the X axial direction (the non-scanning direction) is the Y axial direction. In addition, the rotational (inclined) directions around the X, Y, and Z axes are the θX, θY, and θZ directions, respectively. Furthermore, "substrate" herein includes one in which a semiconductor wafer is coated with a photoresist, and "mask" includes a reticle wherein is formed a device pattern that is reduction projected onto the substrate.

The exposure apparatus EX of the present embodiment is a liquid immersion type exposure apparatus that applies the liquid immersion method to substantially shorten the exposure wavelength, improve the resolution, as well as substantially increase the depth of focus, and includes a liquid supply apparatus 1 that supplies a liquid 50 onto the substrate P, and a liquid recovery apparatus 2 that recovers the liquid 50 on the substrate P. At least during the transfer of the pattern image of the mask M onto the substrate P, the exposure apparatus EX forms the immersion area, by the liquid 50 supplied from the liquid supply apparatus 1, at one part on the substrate P that includes a projection area of the projection optical system PL.

Specifically, the exposure apparatus EX exposes the substrate P by locally filling the liquid 50 between a tip surface (lowest surface) 7 of an optical element 60 of the tip portion of the projection optical system PL and the surface of the substrate P; and then projecting the pattern image of the mask M onto the substrate P via the liquid 50 between this projection optical system PL and the substrate P, and via the projection optical system PL.

The illumination optical system IL illuminates with the exposure light EL the mask M supported by the mask stage MST, and includes: an exposure light source; an optical integrator that uniformizes the intensity of the luminous flux emitted from the exposure light source; a condenser lens that condenses the exposure light EL from the optical integrator; a relay lens system; and a variable field stop that sets to a slit shape an illumination region on the mask M illuminated by the exposure light EL; and the like. The illumination optical system IL illuminates the predetermined illumination region on the mask M with the exposure light EL, having a uniform illumination intensity distribution. Examples of light used as the exposure light EL emitted from the illumination optical system IL include: deep ultraviolet light (DUV light), such as bright lines (g, h, and i lines) in the ultraviolet region emitted from a mercury lamp for example, and KrF excimer laser light (248 nm wavelength); and vacuum ultraviolet light (VUV light), such as ArF excimer laser light (193 nm wavelength) and $F_2$ laser light (157 nm wavelength). ArF excimer laser light is used in the present embodiment.

The mask stage MST supports the mask M, and is two dimensionally movable in the plane perpendicular to the optical axis AX of the projection optical system PL, i.e., in the XY plane, and is finely rotatable in the θZ direction. A mask stage drive apparatus MSTD, such as a linear motor, drives the mask stage MST. The control apparatus CONT controls the mask stage drive apparatus MSTD. A laser interferometer measures in real time the position, in the two dimensional direction, and the rotational angle of the mask M on the mask stage MST, and outputs the measurement results to the control apparatus CONT. The control apparatus CONT drives the mask stage drive apparatus MSTD based on the measurement results of the laser interferometer, thereby positioning the mask M, which is supported by the mask stage MST.

The projection optical system PL projection-exposes the pattern of the mask M onto the substrate P with a predetermined projection magnification β, and includes a plurality of optical elements (lenses), and these optical elements are supported by a lens barrel PK. In the present embodiment, the projection optical system PL is a reduction system having a projection magnification β of, for example, ¼ or ⅕. Furthermore, the projection optical system PL may be either a unity magnification system or an enlargement system.

The projection optical system PL includes: the optical element (first group) 60 disposed on the tip side (the substrate P side) thereof and having an optical member that contacts the liquid 50; and a projection optical system main body (second group) MPL that includes a plurality of optical elements disposed between the optical element 60 and the mask M. The lens barrel PK supports the projection optical system main body MPL, and the optical element 60 is supported separated from the lens barrel PK. The details of the support structure of the optical element 60 and the projection optical system main body MPL will be discussed later. Furthermore, in the present embodiment, the optical element 60 that constitutes the first group consists of one optical member (lens).

The substrate stage PST supports the substrate P, and includes: a Z stage 51 that holds the substrate P via a substrate holder, and an XY stage 52 that supports the Z stage 51. A stage base 53 supports the substrate stage PST includes the Z stage 51 and the XY stage 52. A substrate stage drive apparatus PSTD, such as a linear motor, drives the substrate stage PST. The control apparatus CONT controls the substrate stage drive apparatus PSTD. By driving the Z stage 51, the position in the Z axial direction (the focus position) and in the θX and θY directions of the substrate P held on the Z stage 51 is controlled. In addition, by driving the XY stage 52, the position of the substrate P in the XY direction (the position in a direction substantially parallel to the image plane of the projection optical system PL) is controlled. In other words, the Z stage 51 controls the focus position and the inclination angle of the substrate P and aligns the surface of the substrate P with the image plane of the projection optical system PL by an auto focus system and an auto leveling system; further, the XY stage 52 positions the substrate P in the X axial direction and Y axial direction. It goes without saying that the Z stage and the XY stage may be integrally provided.

A movable mirror 54 that moves integrally with the substrate stage PST is provided on the substrate stage PST (the Z stage 51). In addition, a laser interferometer 55 is provided at a position opposing the movable mirror 54. The laser interferometer 55 measures in real time the position in the two dimensional direction and the rotational angle of the substrate P on the substrate stage PST, and outputs the measurement results to the control apparatus CONT. The control apparatus CONT drives the substrate stage drive apparatus PSTD based on the measurement results of the laser interferometer 55, thereby positioning the substrate P supported on the substrate stage PST.

The exposure apparatus EX includes: the liquid supply apparatus 1 that supplies the predetermined liquid 50 into a space 56 between the tip surface (tip surface of optical element 60) 7 of the projection optical system PL and the substrate P; and the liquid recovery apparatus 2 that recovers the liquid 50 from the space 56. The liquid supply apparatus 1 is for the purpose of filling the liquid 50 in at least one part between the projection optical system PL and the substrate P, and has a tank that stores the liquid 50, a pressurizing pump, and the like. One end of a supply pipe 3 is connected to the liquid supply apparatus 1, and a supply nozzle 4 is connected to the other end of the supply pipe 3. The liquid supply apparatus 1 supplies the liquid 50 into the space 56 via the supply pipe 3 and the supply nozzle 4.

The liquid recovery apparatus 2 has a suction pump, the tank that stores the recovered liquid 50, and the like. One end of a recovery pipe 6 is connected to the liquid recovery apparatus 2, and a recovery nozzle 5 is connected to the other end part of the recovery pipe 6. The liquid recovery apparatus 2 recovers the liquid 50 from the space 56 via the recovery nozzle 5 and the recovery pipe 6. When filling the liquid 50 into the space 56, the control apparatus CONT drives the liquid supply apparatus 1, supplies a predetermined amount of the liquid 50 per unit of time into the space 56 via the supply pipe 3 and the supply nozzle 4, and also drives the liquid recovery apparatus 2 and recovers from the space 56 a predetermined amount of the liquid 50 per unit of time via the recovery nozzle 5 and the recovery pipe 6. Thereby, the liquid 50 is disposed in the space 56 between the tip surface 7 of the projection optical system PL and the substrate P.

In the present embodiment, pure water is used as the liquid 50. Pure water is capable of transmitting not only ArF excimer laser light, but also the exposure light EL if set to deep ultraviolet light (DUV light), such as the bright lines (g, h, and i lines) in the ultraviolet region emitted from, for example, a mercury lamp, and KrF excimer laser light (248 nm wavelength).

Figure 2:
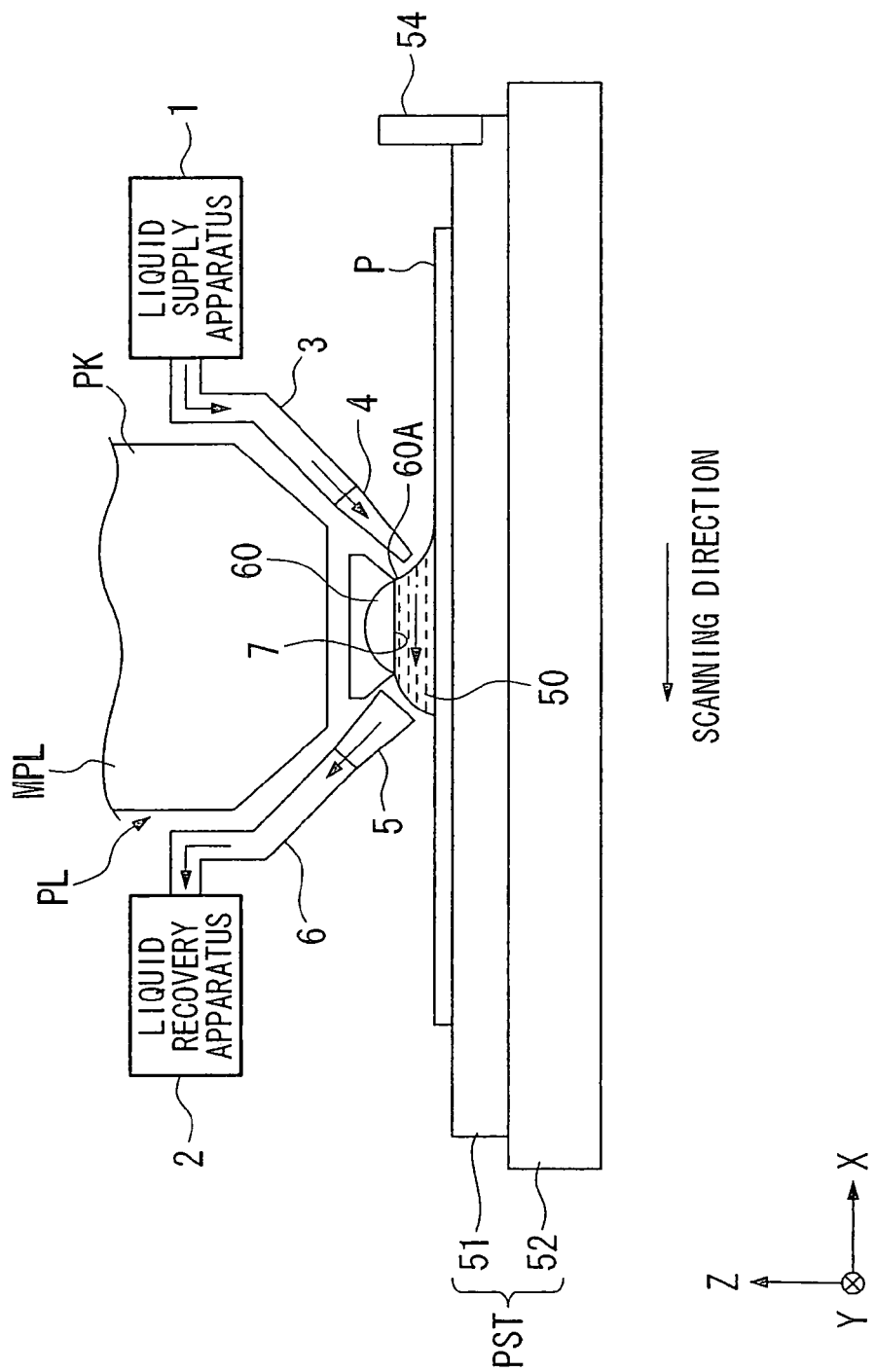
FIG. 2 shows the positional relationship between a tip portion of a projection optical system, a liquid supply apparatus, and a liquid recovery apparatus.

FIG. 2 is a front view that depicts the lower portion of the projection optical system PL of the exposure apparatus EX, the liquid supply apparatus 1, the liquid recovery apparatus 2, and the like. A tip portion 60A of the optical element 60 at the lowest end of the projection optical system PL in FIG. 2 is formed to have rectangular shape which is long in the Y axial direction (the non-scanning direction), leaving just the portion needed in the scanning direction. During scanning exposure, the pattern image of one part of the mask M is projected onto the rectangular projection area directly below the tip portion 60A, and, synchronized to the movement of the mask M at a speed V in the –X direction (or the +X direction) with respect to the projection optical system PL, the substrate P moves at a speed β·V (where β is the projection magnification) in the +X direction (or the –X direction) via the XY stage 52. Further, after the exposure of one shot region is completed, the next shot region moves to the scanning start position by stepping the substrate P, and the exposure process is subsequently performed sequentially for each shot region by the step-and-scan system. In the present embodiment, the liquid 50 flows parallel to and in the same direction as the movement direction of the substrate P.

Figure 3:
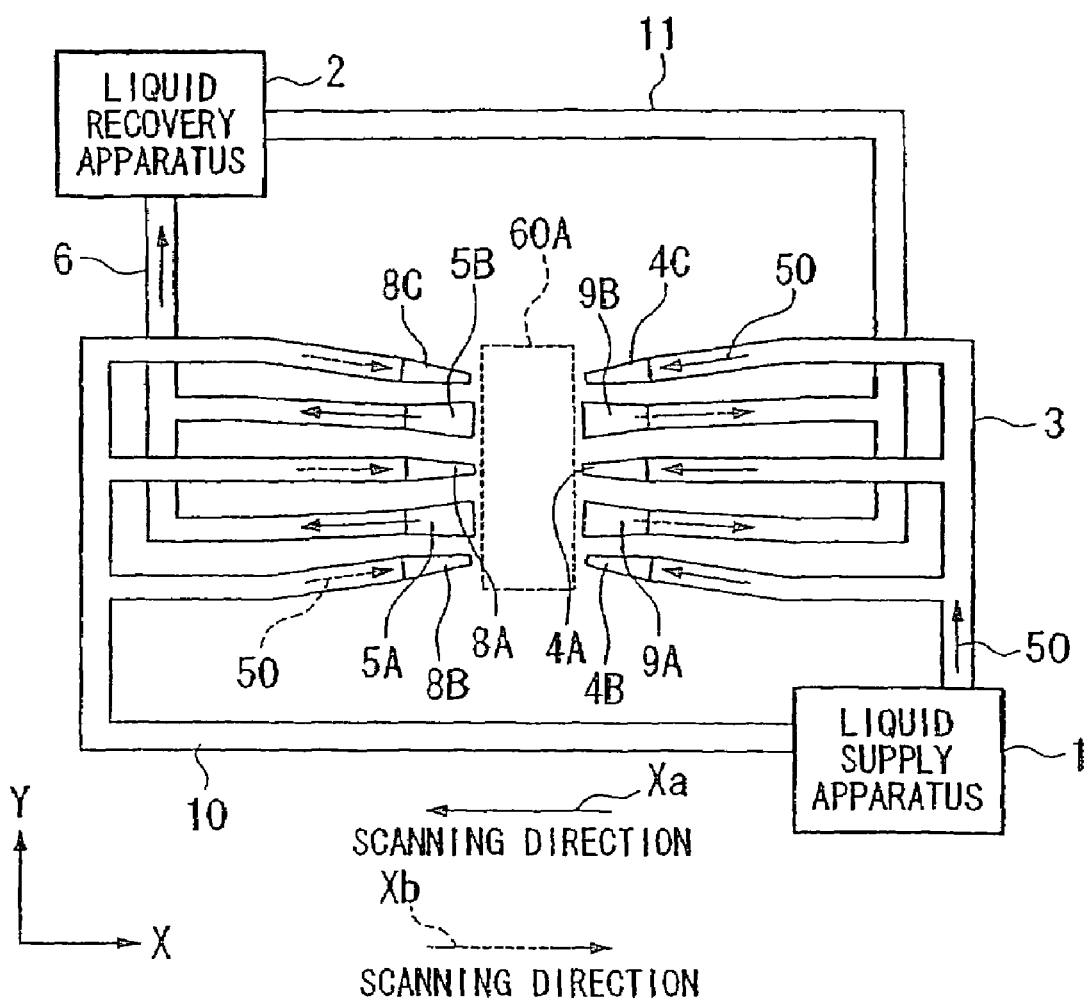
FIG. 3 shows an exemplary arrangement of supply nozzles and recovery nozzles.

FIG. 3 depicts the positional relationship between the tip portion 60A of the lens 60 of the projection optical system PL, the supply nozzles 4 (4A-4C) that supply the liquid 50 in the X axial direction, and the recovery nozzles 5 (5A, 5B) that recover the liquid 50. In FIG. 3, the tip portion 60A of the lens 60 is a rectangular shape that is long in the Y axial direction; further, the three supply nozzles 4A-4C are disposed on the +X side and the two recovery nozzles 5A, 5B are disposed on the –X side so that the tip portion 60A of the lens 60 of the projection optical system PL is interposed therebetween in the X axial direction. Further, the supply nozzles 4A-4C are connected to the liquid supply apparatus 1 via the supply pipe 3, and the recovery nozzles 5A, 5B are connected to the liquid recovery apparatus 2 via the recovery pipe 6. In addition, supply nozzles 8A-8C and recovery nozzles 9A, 9B are disposed substantially 180° rotated from the supply nozzles 4A-4C and the recovery nozzles 5A, 5B. The supply nozzles 4A-4C and the recovery nozzles 9A, 9B are alternately arrayed in the Y axial direction, the supply nozzles 8A-8C and the recovery nozzles 5A, 5B are alternately arrayed in the Y axial direction, the supply nozzles 8A-8C are connected to the liquid supply apparatus 1 via a supply pipe 10, and the recovery nozzles 9A, 9B are connected to the liquid recovery apparatus 2 via a recovery pipe 11.

Figure 4:
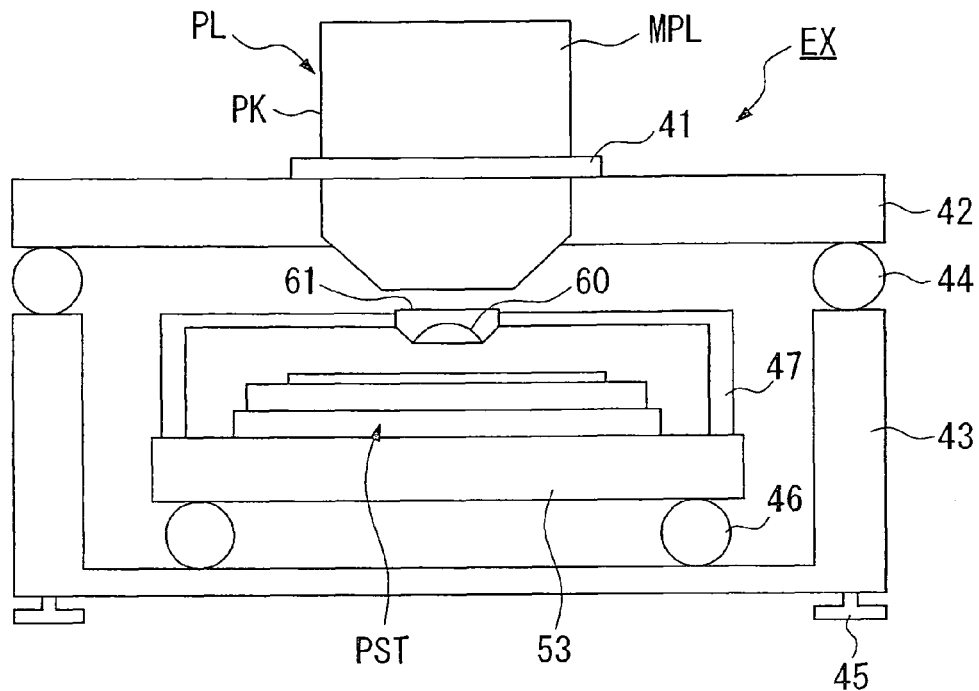
FIG. 4 is a schematic diagram showing the first embodiment of a support structure of the projection optical system.

FIG. 4 is a schematic diagram for explaining the support structure of the projection optical system PL.

Furthermore, to simplify the explanation, the liquid 50, the liquid supply apparatus 1, the liquid recovery apparatus 2, and the like, are omitted from FIG. 4. In FIG. 4, the exposure apparatus EX includes a main frame 42 that supports the projection optical system main body MPL, and a base frame 43 that supports the main frame 42 and the substrate stage PST (the Z stage 51 and the XY stage 52). A flange 41 is provided at the outer circumference of the lens barrel PK that holds the projection optical system main body MPL, and the main frame (second support member) 42 supports the projection optical system main body MPL via this flange 41.

A vibration isolating apparatus 44 is disposed between the main frame 42 and the base frame 43, and the vibration isolating apparatus 44 isolates the main frame 42 from the base frame 43 so that vibrations of the base frame 43 do not transmit to the main frame 42 that holds the projection optical system main body MPL. The base frame 43 is installed substantially horizontally on the floor surface of the clean room via foot parts 45.

The stage base (first base member) 53 is supported on the base frame (second base member) 43 via a vibration isolating apparatus 46. This vibration isolating apparatus 46 isolates the base frame 43 from the stage base 53 so that vibrations of the base frame 43 do not transmit to the stage base 53, and so that vibrations of the stage base 53 do not transmit to the base frame 43.

The substrate stage PST is supported on the stage base 53 in a non-contact manner using air bearings, and the like, and the substrate stage PST is two dimensionally movable on the stage base 53 using linear motors (not shown). A support frame (first support member) 47 is provided on the stage base 53, and the support frame 47 supports a casing (lens cell) 61 that holds the optical element 60. Thus, the support frame 47 that holds the optical element 60 (casing 61) and the main frame 42 that supports the projection optical system main body MPL are isolated via the vibration isolating apparatuses 44, 46 so that vibrations do not mutually transmit.

Furthermore, in the configuration depicted in FIG. 4, a vibration isolating apparatus the same as the vibration isolating apparatuses 44, 46 may be provided between the support frame 47 and the stage base 53, and an elastic member, such as rubber, may be disposed so that vibrations that do transmit between the support frame 47 and the stage base 53 are attenuated.

Figure 5:
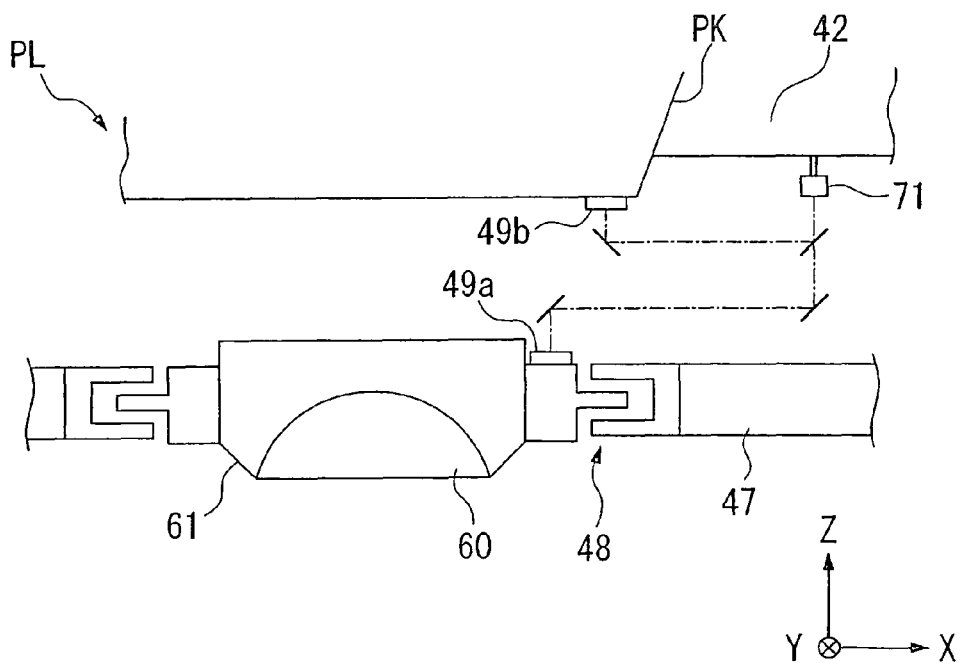
FIG. 5 is a schematic diagram showing one example of a support structure of a first group.

FIG. 5 is an enlarged view of the vicinity of the optical element 60 of the projection optical system PL.

A voice coil motor (drive mechanism) 48 is disposed between the support frame 47 and the casing 61 that holds the optical element 60, the support frame 47 supports the casing 61 via the voice coil motor 48 in a non-contact manner, and the optical element 60 held by the casing 61 is movable in the Z axial direction by driving the voice coil motor 48. In addition, the main frame 42 is provided with an interferometer (measuring apparatus) 71 that receives reflected light from a measuring mirror 49a affixed to the casing 61 and from a measuring mirror 49b affixed to the lens barrel PK, and measures the spacing between the projection optical system main body MPL and the optical element 60. Three voice coil motors 48 are disposed between the casing 61 and the support frame 47 at, for example, 120° intervals from one another, and are constituted so that they can each move independently, so that they can move in the Z axial direction, and so that they can incline with respect to the projection optical system MPL. Based on the measurement result of the interferometer 71, the voice coil motor 48 is controlled so that the predetermined positional relationship (predetermined spacing) between the projection optical system main body MPL and the optical element 60 is maintained.

The following explains the procedure for using the exposure apparatus EX discussed above to expose the pattern of the mask M onto the substrate P.

After the mask M is loaded on the mask stage MST and the substrate P is loaded on the substrate stage PST, the control apparatus CONT drives the liquid supply apparatus 1, and starts the operation to supply liquid to the space 56. Further, if scanning exposure is performed by moving the substrate P in the scanning direction (the −X direction) depicted by an arrow Xa (refer to FIG. 3), then the liquid supply apparatus 1 and the liquid recovery apparatus 2 use the supply pipe 3, the supply nozzles 4A-4C, the recovery pipe 6, and the recovery nozzles 5A, 5B to supply and recover the liquid 50. Namely, when the substrate P moves in the −X direction, the liquid 50 is supplied between the projection optical system PL and the substrate P from the liquid supply apparatus 1 via the supply pipe 3 and the supply nozzles 4 (4A-4C), the liquid 50 is also recovered by the liquid recovery apparatus 2 via the recovery nozzles 5 (5A, 5B) and the recovery pipe 6, and the liquid 50 thereby flows in the −X direction so that it fills between the optical element 60 and the substrate P. On the other hand, if scanning exposure is performed by moving the substrate P in the scanning direction (the +X direction) depicted by an arrow Xb, then the liquid supply apparatus 1 and the liquid recovery apparatus 2 use the supply pipe 10, the supply nozzles 8A-8C, the recovery pipe 11, and the recovery nozzles 9A, 9B to supply and recover the liquid 50. Namely, when the substrate P moves in the +X direction, the liquid 50 is supplied between the projection optical system PL and the substrate P by the liquid supply apparatus 1 via the supply pipe 10 and the supply nozzles 8 (8A-8C), the liquid 50 is also recovered by the liquid recovery apparatus 2 via the recovery nozzles 9 (9A, 9B) and the recovery pipe 11, and the liquid 50 thereby flows in the +X direction so that it fills between the optical element 60 and the substrate P. In this case, the liquid 50 can be easily supplied into the space 56, even if the supplied energy of the liquid supply apparatus 1 is small, because the liquid 50 supplied, for example, from the liquid supply apparatus 1 via the supply nozzles 4 flows so that it is drawn into the space 56 as the substrate P moves in the −X direction. Further, even if the substrate P is scanned in either the +X direction or the −X direction by switching the direction in which the liquid 50 flows in accordance with the scanning direction, the liquid 50 can be filled between the tip surface 7 of the optical element 60 and the substrate P, and a high resolution and large depth of focus can thereby be obtained.

Here, a cooling apparatus may be provided that cools a coil part of the voice coil motor 48 to set a predetermined temperature. In that case, water may be used as the refrigerant for that cooling apparatus, which may be shared with part of the temperature regulating apparatus that sets the liquid 50 to a predetermined temperature.

In addition, the interferometer 71 continuously monitors the spacing between the lens barrel PK that holds the projection optical system main body MPL and the casing 61 that holds the optical element 60; if the spacing changes due to, for example, vibrations of the substrate stage PST and/or a pressure change in the liquid 50, then, based on the measurement result from the interferometer 71, the voice coil motor 48 moves the optical element 60 held by the casing 61, thereby maintaining the spacing (positional relationship) between the projection optical system main body MPL and the optical element 60 in a predetermined state.

Thus, in the present embodiment, the main frame 42 that supports the projection optical system main body MPL and the support frame 47 that holds the optical element 60 are vibrationally isolated, and it is therefore possible to prevent vibrations transmitted to the optical element 60 from being transmitted to the projection optical system main body MPL. In addition, because the optical element 60 is supported by the support frame 47 via the voice coil motor 48 in a non-contact manner, thereby protected against vibrations from the support frame 47, the position in the X axial and Y axial directions is stable, and the position in the Z axial direction is also controlled by the voice coil motor 48; therefore, the optical element 60 can be positioned in a predetermined state with respect to the projection optical system main body MPL. Accordingly, even if performing an immersion exposure by filling the liquid 50 between the optical element 60 of the projection optical system PL and the substrate P, the desired pattern image can be formed on the substrate P without causing any degradation of the pattern image. In addition, if the lens barrel PK is provided with a reference mirror used with the interferometer 55 to monitor the substrate stage PST as well as with an interferometer (not shown) to monitor the mask stage MST, then vibrations of the optical element 60 do not transmit to the lens barrel PK, and it is therefore possible to prevent measurement errors in each of the interferometers.

Furthermore, a plurality of measuring mirrors may be provided respectively for the projection optical system main body MPL and the casing 61, and the spacing between the projection optical system main body MPL and the casing 61, as well as their relative inclination and their relative position in the X axial direction and the Y axial direction, may also be measured. In addition, based on those measurement results, the voice coil motor 48 may, for example, incline the optical element 60, move the optical element 60 in the X axial direction and/or the Y axial direction. In addition, the present embodiment is constituted to move the optical element 60, but may be constituted to move the projection optical system main body MPL. In addition, if the projection state (imaging state) of the pattern image projected on the substrate P changes due to fluctuations in the optical element 60, then a part of the plurality of optical members that constitute the projection optical system main body MPL may be moved so as to compensate for changes in the projection state.

Furthermore, in the first embodiment discussed above, the interferometer system (49a, 49b, 71) is used as the measuring apparatus, but a measuring apparatus employing another system may be used provided that it can measure the positional relationship between the projection optical system main body MPL and the optical element 60 with a predetermined accuracy. For example, instead of the interferometer system discussed above, it is acceptable to use a measuring apparatus that optically measures the relative position information of measurement marks disposed respectively on the lens barrel PK and the casing 61.

Figure 6:
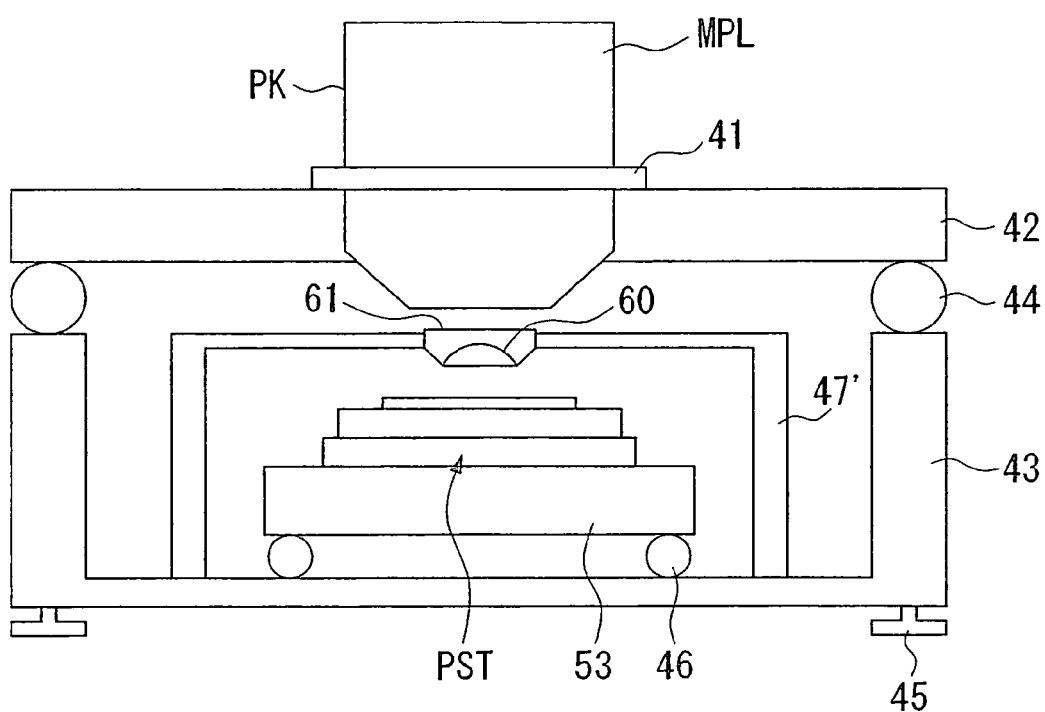
FIG. 6 is a schematic diagram showing the second embodiment of the support structure of the projection optical system.

FIG. 6 is a schematic diagram that depicts another embodiment of the support structure of the projection optical system.

Figure 14:
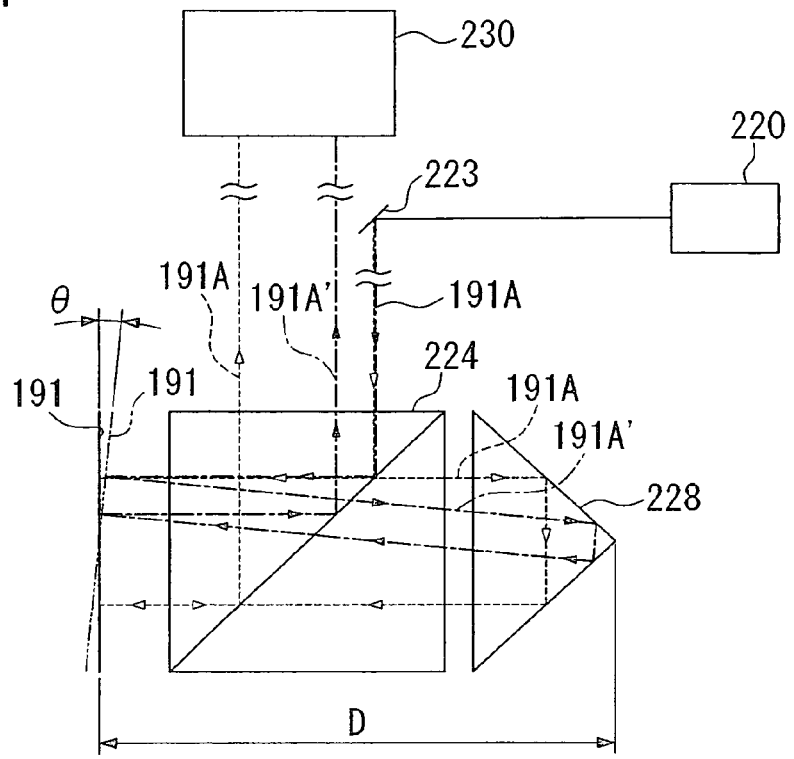
FIG. 14 is a schematic view for explaining the features of the double pass interferometer depicted in FIG. 13.

The present embodiment differs from the embodiment of the support structure of the projection optical system explained referencing FIG. 14 on the point that a support frame 47' that supports the casing 61 that holds the optical element 60 is affixed to the base frame 43. In the present embodiment as well, the main frame 42 that supports the projection optical system main body MPL and the support frame 47' that holds the optical element 60 are vibrationally isolated, and vibrations transmitted to the optical element 60 thereby do not transmit to the projection optical system main body MPL, and the positional relationship between the projection optical system main body MPL and the optical element 60 is also maintained in a predetermined state; therefore, the desired pattern image can be formed on the substrate P without causing degradation of the pattern image, even if performing an immersion exposure by filling the liquid 50 between the optical element 60 of the projection optical system PL and the substrate P.

Furthermore, if the projection optical system main body MPL and the optical element 60 are vibrationally isolated, then the respective support member (frame) is not limited to the embodiments discussed above.

In addition, in the abovementioned embodiments, the casing 61 is constituted so that it holds only one optical element 60, but may hold a plurality of optical elements that includes the optical element 60. In addition, in embodiments discussed above, the projection optical system PL is divided into two groups: the optical element 60, and the projection optical system main body MPL between the mask M and the optical element 60; however, it may be separated into three or more groups, and the relative position of the first group, including the optical element 60, and the groups not adjacent to that first group may be maintained in a predetermined state.

The above embodiments are not particularly limited to the nozzle configurations discussed above, e.g., the liquid 50 may be supplied and recovered by two pairs of nozzles on the long sides of the tip part 60A. Furthermore, in this case, the supply nozzles and the recovery nozzles may be disposed so that they are arrayed vertically in order to enable the supply and recovery of the liquid 50 from either the +X direction or the −X direction.

(Second Embodiment of the Exposure Apparatus)

Figure 7:
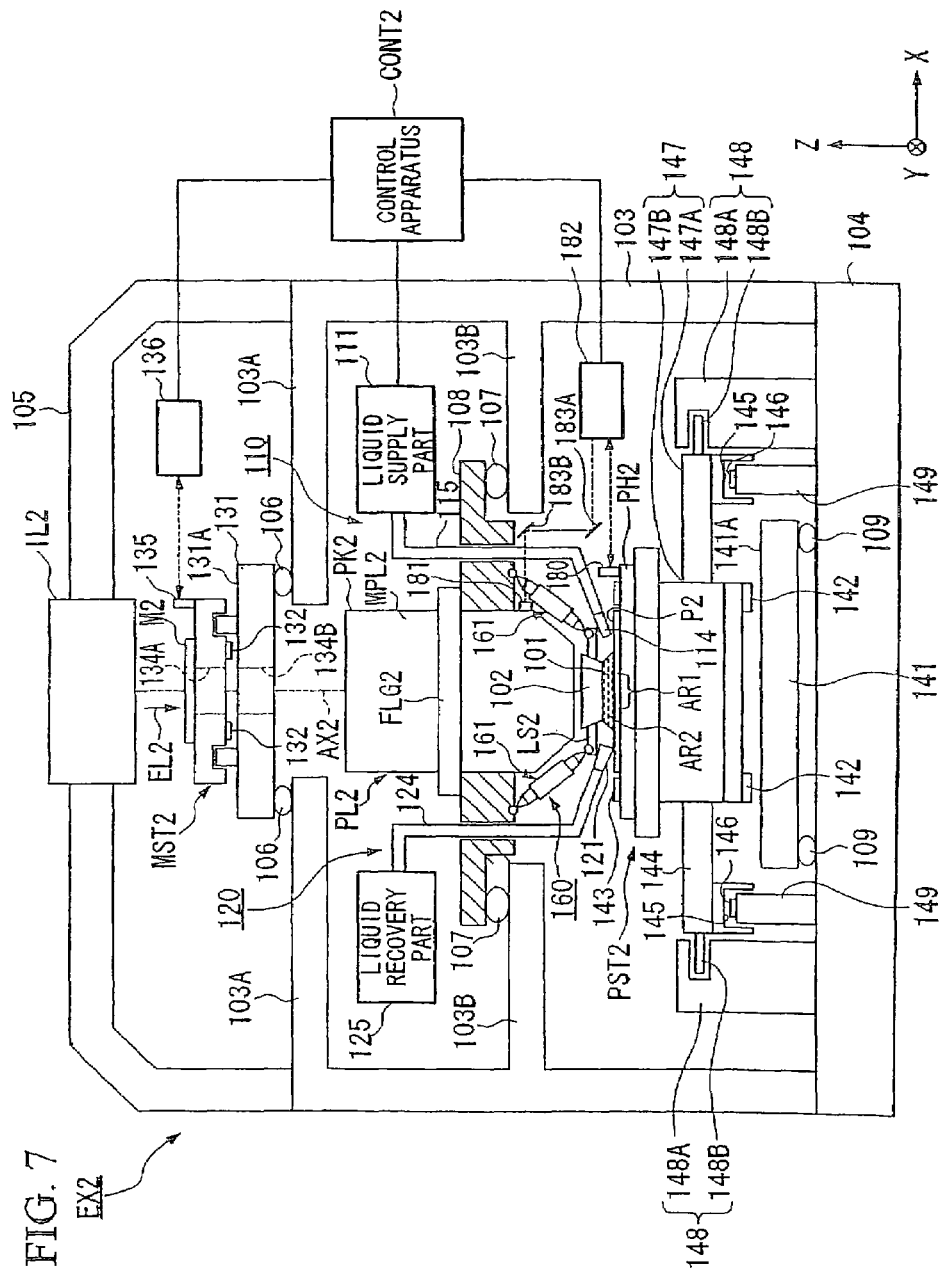
FIG. 7 is a schematic block diagram showing the second embodiment of the exposure apparatus of the present invention.

FIG. 7 is a schematic block diagram that depicts the second embodiment of the exposure apparatus according to the present invention.

In FIG. 7, an exposure apparatus EX2 includes a mask stage MST2 that supports a mask M2, a substrate stage PST2 that supports a substrate P2, an illumination optical system IL2 that illuminates the mask M2 supported by the mask stage MST2 with exposure light EL2, a projection optical system PL2 that projects and exposes the pattern image of the mask M2 illuminated by the exposure light EL2 onto the substrate P2 supported by the substrate stage PST2, and a control apparatus CONT2 that performs overall control of the operation of the entire exposure apparatus EX2. Furthermore, the exposure apparatus EX2 includes a main column 103 that supports the mask stage MST2 and the projection optical system PL2. The main column 103 is installed on the base plate 104 which is placed horizontally upon the floor surface. An upper side step part (upper side support part) 103A and a lower side step part (lower side support part) 103B that protrude inwardly are formed in the main column 103.

The exposure apparatus EX2 of the present embodiment is a liquid immersion type exposure apparatus that applies the liquid immersion method to substantially shorten the exposure wavelength, improve the resolution, as well as substantially increase the depth of focus, and includes a liquid supply mechanism 110 that supplies a liquid 101 onto the substrate P2, and a liquid recovery mechanism 120 that recovers the liquid 101 on the substrate P2. At least during the transfer of the pattern image of the mask M2 onto the substrate P2, the exposure apparatus EX2 forms an immersion area AR2, by the liquid 101 supplied from the liquid supply mechanism 110, at one part on the substrate P2 that includes a projection area AR1 of the projection optical system PL2. Specifically, the exposure apparatus EX2 exposes the substrate P2 by locally filling the liquid 101 between an optical member (optical element) 102 of the tip part (terminal end part) of the projection optical system PL2 and the surface of the substrate P2; and then projecting the pattern image of the mask M2 onto the substrate P2 via the liquid 101 between the projection optical system PL2 and the substrate P2, and via the projection optical system PL2.

As an example, the present embodiment explains a case of using, as the exposure apparatus EX2, a scanning type exposure apparatus (a so-called scanning stepper) that, while synchronously moving the mask M2 and the substrate P2 in mutually different directions (opposite directions) in the scanning direction, exposes the substrate P2 with the pattern formed on the mask M2. In the following explanation, the direction that coincides with an optical axis AX2 of the projection optical system PL2 is the Z axial direction, the direction in which the mask M2 and the substrate P2 synchronously move in the plane perpendicular to the Z axial direction (the scanning direction) is the X axial direction, and the direction perpendicular to the Z axial direction and the X axial direction (the non-scanning direction) is the Y axial direction. In addition, the rotational (inclined) directions around the X, Y, and Z axes are the θX, θY, and θZ directions, respectively. Furthermore, "substrate" herein includes one in which a semiconductor wafer is coated with a photoresist, which is a photosensitive material, and "mask" includes a reticle wherein is formed a device pattern that is reduction projected onto the substrate.

The illumination optical system IL2 is supported by a support column 105 fixed to the upper part of the main column 103. The illumination optical system IL2 illuminates with the exposure light EL2 the mask M2 supported by the mask stage MST2, and includes: an exposure light source; an optical integrator that uniformizes the intensity of the luminous flux emitted from the exposure light source; a condenser lens that condenses the exposure light EL2 from the optical integrator; a relay lens system; a variable field stop that sets to a slit shape an illumination region on the mask M2 illuminated by the exposure light EL2; and the like. The illumination optical system IL2 illuminates the predetermined illumination region on the mask M2 with the exposure light EL2, having a uniform illumination intensity distribution. Examples of light used as the exposure light EL2 emitted from the illumination optical system IL2 include: deep ultraviolet light (DUV light), such as bright lines (g, h, and i lines) in the ultraviolet region emitted from a mercury lamp for example, and KrF excimer laser light (248 nm wavelength); and vacuum ultraviolet light (VUV light), such as ArF excimer laser light (193 nm wavelength) and $F_2$ laser light (157 nm wavelength). ArF excimer laser light is used in the present embodiment.

In the present embodiment, pure water is used as the liquid 101. Pure water is capable of transmitting not only ArF excimer laser light, but also deep ultraviolet light (DUV light), such as the bright lines (g, h, and i lines) in the ultraviolet region emitted from, for example, a mercury lamp, and KrF excimer laser light (248 nm wavelength).

The mask stage MST2 supports the mask M2, and includes an aperture 134A at its center part through which passes the pattern image of the mask M2. A mask base plate 131 is supported on the upper side step part 103A of the main column 103 via a vibration isolating unit 106. An aperture 134B through which passes the pattern image of the mask M2 is also formed at the center part of the mask base plate 131. A plurality of gas bearings (air bearings) 132, which are non-contact bearings, is provided at the lower surface of the mask stage MST2. The mask stage MST2 is supported by the air bearings 132 in a non-contact manner with respect to an upper surface (guide surface) 131A of the mask base plate 131, and is two dimensionally movable by the mask stage drive mechanism, such as a linear motor, within a plane perpendicular to the optical axis AX2 of the projection optical system PL2, i.e., within the XY plane, and is finely rotatable about the θZ direction. A movable mirror 135 is provided at a predetermined position on the +X side on the mask stage MST2. In addition, a laser interferometer 136 is provided at a position opposing the movable mirror 135. Likewise, although not shown, a movable mirror is also provided on the +Y side on the mask stage MST2, and a laser interferometer is provided at a position opposing thereto. The laser interferometer 136 measures in real time the position, in the two dimensional direction, and the rotational angle in the θZ direction (depending on the case, also including the rotational angles in the θX, θY directions) of the mask M2 on the mask stage MST2, and outputs the measurement results to the control apparatus CONT2. The control apparatus CONT2 drives the mask stage drive mechanism based on the measurement results of the laser interferometer 136, thereby positioning the mask M2, which is supported by the mask stage MST2.

The projection optical system PL2 projects and exposes the pattern of the mask M2 onto the substrate P2 with a predetermined projection magnification β. In the present embodiment, the projection optical system PL2 is a reduction system having a projection magnification P of, for example, ¼ or ⅕. Furthermore, the projection optical system PL2 may be either a unity magnification system or an enlargement system. The projection optical system PL2 includes: the optical element (first group) 102 disposed on the terminal side (the substrate P2 side) thereof and that contacts the liquid 101; and an optical group (second group) MPL2 that includes a plurality of optical elements disposed between the optical member 102 and the mask M2 having a pattern. Furthermore, in the present embodiment, the first group has only the optical member 102, i.e., only one lens element (optical element). A metal lens cell (first holding member) LS2 holds the lens element 102. The lens cell LS2 is made of metal, and a spring mechanism (not shown) is interposed between the lens cell LS2 and the lens element 102. Further, a lens barrel (second holding member) PK2 holds the optical group MPL2. The lens cell LS2 and the lens barrel PK2 are isolated.

An outer circumferential part of the lens barrel PK2 is provided with a flange part FLG2. In addition, a lens barrel base plate 108 is supported via a vibration isolating unit 107 on the lower side step part 103B of the main column 103. Furthermore, engaging the flange part FLG2 to the lens barrel base plate 108 causes the lens barrel PK2, which holds the optical group MPL2, to be supported by the lens barrel base plate (frame member) 108.

The lens cell LS2 that holds the lens element 102 is coupled to the lens barrel base plate 108 by a coupling apparatus 160, which is discussed in detail later, and supported by the lens barrel base plate 108 via the coupling apparatus 160. The lens element 102 held by the lens cell LS2 is movable by the coupling apparatus 160 with respect to the optical group MPL2 held by the lens barrel PK2.

Each of the plurality of optical elements that constitutes the projection optical system PL2 is made of fluorite or quartz, and aspherical surface polishing process is applied to the curved surface of a part of the optical elements. In particular, if the lens element 102 is made of fluorite, then this fluorite will unfortunately corrode due to water if left as is over a long period of time, and it is therefore coated beforehand with an appropriate thin film to increase its affinity. Thereby, the liquid 101 can be made to closely contact the substantially entire surface of the liquid contact surface of the lens element 102, and the optical path between the lens element 102 and the substrate P2 can thereby be reliably filled with the liquid 101. Furthermore, the lens element 102 may also be made of quartz, which has a high affinity for water. In addition, if the liquid contact surface of the lens element 102 is treated to make it hydrophilic (lyophilic), such as with a coating, and its affinity for water is thereby increased, then it may have a special film structure (for example, a film that changes its molecular arrangement if an electric field is applied, or a film that increases in temperature if a minute electric current flows) so that, in a dried state wherein the water has been removed from the immersion area AR2, moisture from the liquid contact surface of the lens element 102 rapidly escapes.

The substrate stage PST2 is movable while holding the substrate P2 by suction via a substrate holder PH2, and a plurality of gas bearings (air bearing) 142, which are non-contact bearings, is provided at the lower surface thereof. A substrate base plate 141 is supported on a base plate 104 via a vibration isolating unit 109. A substrate stage PST2 is supported by the air bearings 142 in a non-contact manner with respect to an upper surface (guide surface) 141A of the substrate base plate 141, and is finely rotatable in the θZ direction and two dimensionally movable within a plane perpendicular to the optical axis AX2 of the projection optical system PL2, i.e., within the XY plane, by a substrate stage drive mechanism, such as a linear motor. Furthermore, the substrate stage PST2 is also movable in the Z axial direction, the θX direction, and the θY direction. The control apparatus CONT2 controls the substrate stage drive mechanism. The substrate stage PST2 aligns the surface of the substrate P2 with the image plane of the projection optical system PL2 by an auto focus system and an auto leveling system, by controlling the focus position (Z position) and the inclination angle of the substrate P2, and also positions the substrate P2 in the X axial direction and the Y axial direction.

A movable mirror 180 that moves integrally with the substrate stage PST2 is provided at a predetermined position on the +X side on the substrate stage PST2 (substrate holder PH2), and a reference mirror (fixed mirror) 181 is provided at a predetermined position on the +X side of the lens barrel PK2. In addition, a laser interferometer 182 is provided at a position opposing the movable mirror 180. The laser interferometer 182 irradiates the movable mirror 180 with a measuring beam (measuring light), and also irradiates the reference mirror 181 with a reference beam (reference light) via mirrors 183A, 183B. The reflected light of each of the movable mirror 180 and the reference mirror 181 based on the irradiated measuring beam and the reference beam is received by a light receiving part of the laser interferometer 182. The laser interferometer 182 causes these light beams to interfere, and measures the amount of change in the optical path length of the measuring beam, using the optical path length of the reference beam as a reference, and the position (coordinate) and/or displacement of the movable mirror 180, using the reference mirror 181 as a reference. The lens barrel PK2 supports the reference mirror 181, and the substrate holder PH2 (substrate stage PST2) supports the movable mirror 180. Likewise, although not shown, a movable mirror and a reference mirror are also provided on the +Y side of the lens barrel PK2 on the substrate stage PST2 respectively, and a laser interferometer is provided at a position opposing thereto. The laser interferometer 182 measures in real time the position in the two dimensional direction and the rotational angle of the substrate P2, and the measurement results are outputted to the control apparatus CONT2. The control apparatus CONT2 moves and positions the substrate P2 supported by the substrate stage PST2 by driving the substrate stage drive mechanism, which includes a linear motor, based on the measurement results of the laser interferometer 182.

In addition, an auxiliary plate 143 that surrounds the substrate P2 is provided on the substrate stage PST2 (substrate holder PH2). The auxiliary plate 143 has a flat surface of substantially the same height as the surface of the substrate P2 held by the substrate holder PH2. The liquid 101 can be held below the projection optical system PL2 using the auxiliary plate 143 even when exposing the edge area of the substrate P2.

The substrate stage PST2 is supported freely movable in the X axial direction by an X guide stage 144. The substrate stage PST2 is movable by a predetermined stroke in the X axial direction by an X linear motor 147 while being guided by the X guide stage 144. The X linear motor 147 includes a stator 147A provided in the X guide stage 144 extending in the X axial direction, and a slider 147B provided corresponding to the stator 147A and fixed to the substrate stage PST2. Furthermore, the substrate stage PST2 moves in the X axial direction by driving the slider 147B with respect to the stator 147A. Here, the substrate stage PST2 is supported, in a non-contact manner, by a magnetic guide including an actuator and a magnet that maintains a gap of a predetermined size in the Z axial direction with respect to the X guide stage 144. The X linear motor 147 moves the substrate stage PST2 in the X axial direction in a state supported by the X guide stage 144 in a non-contact manner.

The ends of the X guide stage 144 in the longitudinal direction are each provided with one of the pair of Y linear motors 148 capable of moving this X guide stage 144 along with the substrate stage PST2 in the Y axial direction. The Y linear motors 148 respectively include sliders 148B, provided at both ends of the X guide stage 144 in the longitudinal direction, and stators 148A provided corresponding to these sliders 148B.

Furthermore, the X guide stage 144 along with the substrate stage PST2 moves in the Y axial direction by driving the sliders 148B with respect to the stators 148A. In addition, the X guide stage 144 can also be rotated in the θZ direction by adjusting the respective drives of the Y linear motors 148. Accordingly, the substrate stage PST2 is movable substantially integrally with the X guide stage 144 in the Y axial direction and the θZ direction by these linear motors 148.

Guides 149 that guide the movement of the X guide stage 144 in the Y axial direction are provided respectively on both sides of the substrate base plate 141 in the X axial direction. Each guide part 149 is supported on the base plate 104. Further, a U-shaped guided member 145 is provided on the lower surface of the X guide stage 144 at each end of the X guide stage 144 in the longitudinal direction. Each guide part 149 is provided so that it engages with the respective guided member 145, and so that the upper surface (the guide surface) of each guide part 149 opposes the inner surface of the guided member 145. The guide surface of each guide part 149 is provided with a gas bearing (air bearing) 146, which is a non-contact bearing, and the X guide stage 144 is supported by the guide surfaces of the guide parts 149 in a non-contact manner.

Figure 8:
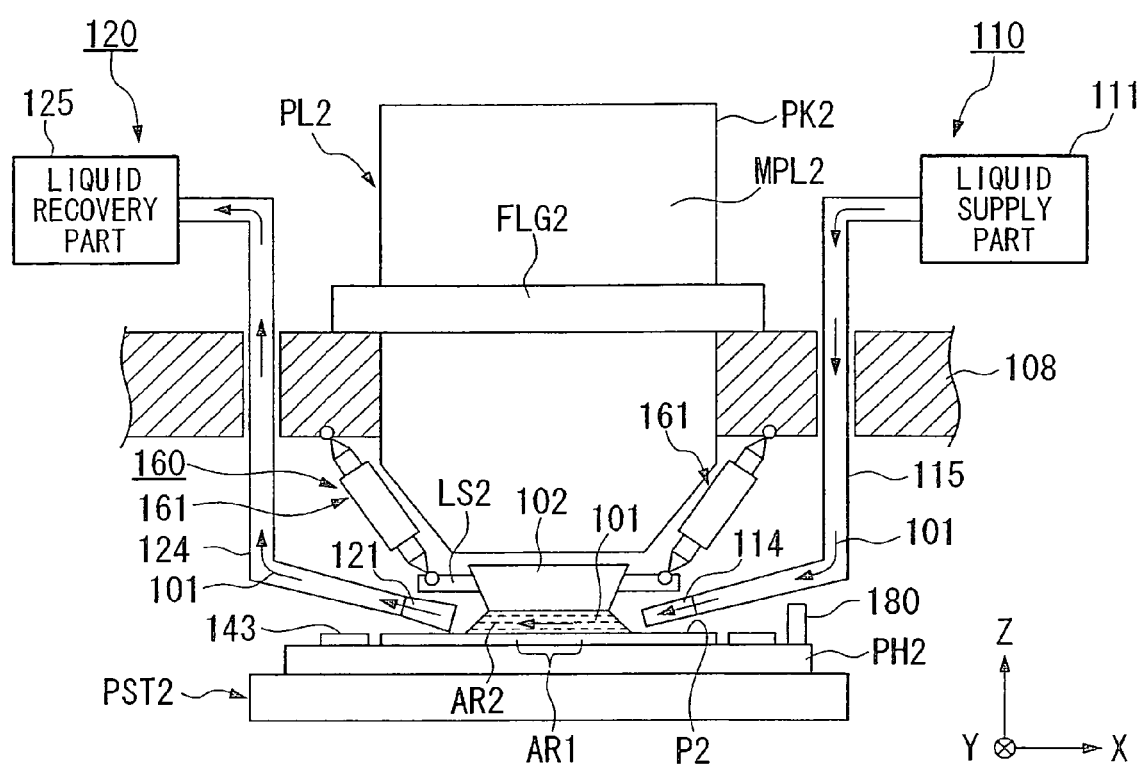
FIG. 8 shows the positional relationship between the tip portion of the projection optical system, a liquid supply mechanism, and a liquid recovery mechanism.

FIG. 8 is an enlarged view that depicts the vicinity of the liquid supply mechanism 110, the liquid recovery mechanism 120, and the tip portion of the projection optical system PL2.

The liquid supply mechanism 110 supplies the liquid 101 between the projection optical system PL2 and the substrate P2, and includes a liquid supply section 111 capable of feeding the liquid 101; and supply nozzles 114, which are connected to the liquid supply section 111 via a supply pipe 115, that supply the liquid 101 fed from this liquid supply section 111 onto the substrate P2. The supply nozzles 114 are disposed proximate to the surface of the substrate P2. The liquid supply section 111 includes a tank that stores the liquid 101, a pressurizing pump, a temperature regulator that adjusts the temperature of the liquid 101 to be supplied, and the like, and supplies the liquid 101 onto the substrate P2 via the supply pipe 115 and the supply nozzles 114. The control apparatus CONT2 controls the operation by which the liquid supply section 111 supplies the liquid, and can control the amount of liquid supplied per unit of time onto the substrate P2 by the liquid supply section 111.

The liquid recovery mechanism 120 recovers the liquid 101 on the substrate P2 supplied by the liquid supply mechanism 110, and includes recovery nozzles 121 disposed proximate to the surface of the substrate P2, and a liquid recovery section 125 connected to the recovery nozzles 121 via a recovery pipe 124. The liquid recovery section 125 includes a suction pump, and a tank that can store the recovered liquid 101. The liquid 101 recovered by the liquid recovery section 125 is, for example, discharged, or cleaned and returned to the liquid supply section 111, and the like, for reuse.

When forming the immersion area AR2 on the substrate P2, the control apparatus CONT2 drives the liquid supply section 111 to supply a predetermined amount of the liquid 101 per unit of time via the supply pipe 115 and the supply nozzles 114, and also drives the liquid recovery section 125 to recover a predetermined amount of the liquid 101 per unit of time via the recovery nozzles 121 and the recovery pipe 124. Thereby, an immersion area AR2 of the liquid 101 is formed between the lens element 102 of the terminal end part of the projection optical system PL2 and the substrate P2.

Furthermore, as depicted in the partial cross sectional views of FIG. 7 and FIG. 8, the liquid supply mechanism 110 and the liquid recovery mechanism 120 are supported and isolated from the lens barrel base plate 108. Thereby, vibrations produced by the liquid supply mechanism 110 and the liquid recovery mechanism 120 do not transmit to the projection optical system PL2 via the lens barrel base plate 108.

Figure 9:
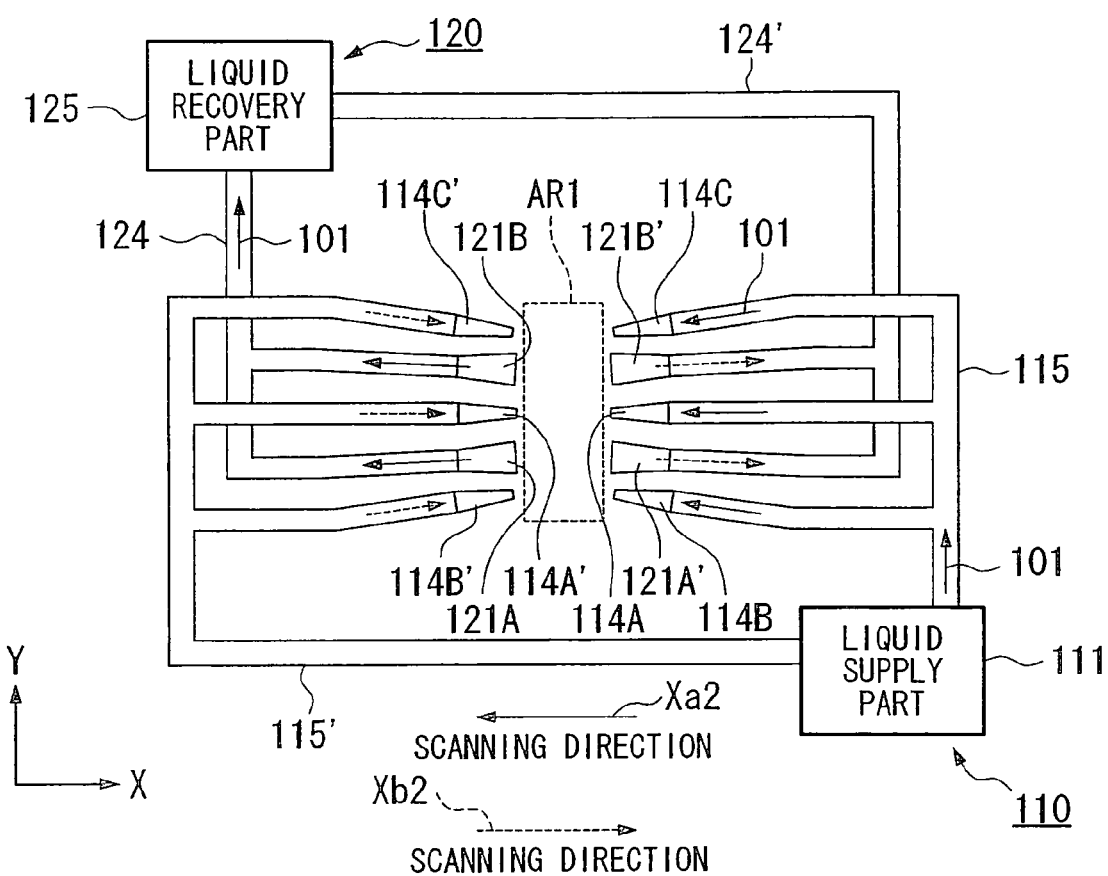
FIG. 9 shows an exemplary arrangement of the supply nozzles and the recovery nozzles.

FIG. 9 is plan view that depicts the positional relationship between the liquid supply mechanism 110, the liquid recovery mechanism 120, and the projection area AR1 of the projection optical system PL2. The projection area AR1 of the projection optical system PL2 is a rectangular shape (slit shape) that is long in the Y axial direction; further, the three supply nozzles 114A-114C are disposed on the +X side and the two recovery nozzles 121A, 121B are disposed on the −X side so that the projection area AR1 is interposed therebetween in the X axial direction. Furthermore, the supply nozzles 114A-114C are connected to the liquid supply section 111 via the supply pipe 115, and the recovery nozzles 121A, 121B are connected to the liquid recovery section 125 via the recovery pipe 124. In addition, supply nozzles 114A'-114C' and recovery nozzles 121A', 121B' are disposed in an arrangement substantially 180° rotated from the supply nozzles 114A-114C and the recovery nozzles 121A, 121B. The supply nozzles 114A-114C and the recovery nozzles 121A', 121B' are alternately arrayed in the Y axial direction, the supply nozzles 114A'-114C' and the recovery nozzles 121A, 121B are alternately arrayed in the Y axial direction, the supply nozzles 114A'-114C' are connected to the liquid supply section 111 via a supply pipe 115', and the recovery nozzles 121A', 121B' are connected to the liquid recovery section 125 via a recovery pipe 124'.

Figure 10:
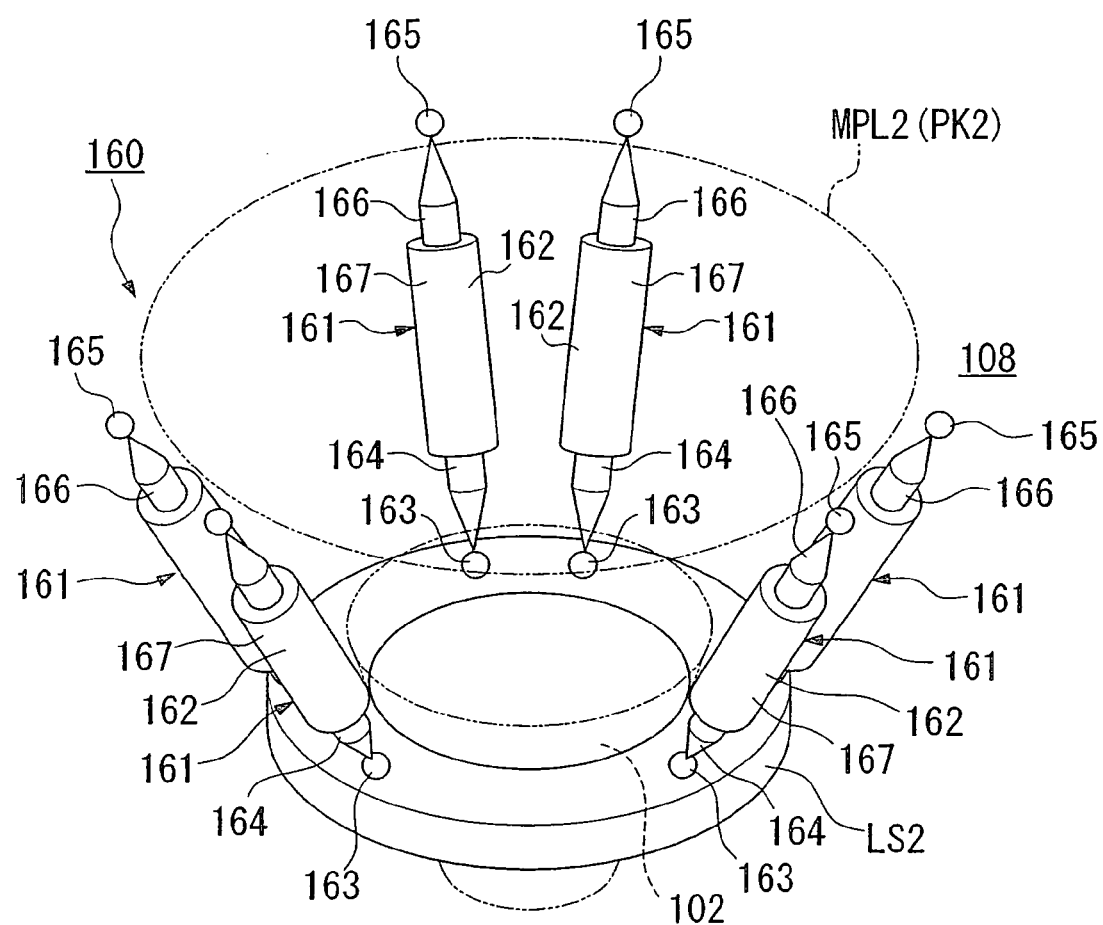
FIG. 10 is a schematic oblique view showing a coupling apparatus.

FIG. 10 is an oblique view that depicts the coupling apparatus 160 that couples the lens cell LS2 and the lens barrel base plate 108.

The coupling apparatus 160 includes a parallel link mechanism provided with a plurality of link parts 161 arranged in a row and each having an actuator unit 162. In the present embodiment, the coupling apparatus 160 is a six degrees of freedom parallel link mechanism including six link parts 161, and the lens cell LS2 is kinematically supported. In the present embodiment, the link parts 161 are disposed at substantially 120° intervals, two at a time as pairs. Furthermore, the six link parts 161 may be arranged at equal intervals, or may be arranged at unequal intervals.

Each link part 161 includes a first linking member 164 linked to the lens cell LS2 via a spherical bearing 163, and a second linking member 166 linked to the lens barrel base plate 108 via a spherical bearing 165. The first and second linking members 164, 166 are shaft shaped members, and are provided movable in the axial direction with respect to a tubular member 167 that constitutes the actuator unit 162. Furthermore, the first and second linking members 164, 166 can be moved in the axial direction with respect to the tubular member 167 of the actuator unit 162 by driving the actuator unit 162, and thereby the link part 161 can maintain or change (expand or contract) the spacing between the spherical bearing 163 and the spherical bearing 165.

By expanding and contracting each of the link parts 161, the coupling apparatus 160 can maintain or adjust the attitude of the lens cell LS2 with respect to the lens barrel base plate 108. Because the lens barrel PK2 that holds the optical group MPL2 is supported by the lens barrel base plate 108, and the lens element 102 is held by the lens cell LS2, the coupling apparatus 160 can substantially maintain or adjust the attitude of the lens element 102 with respect to the optical group MPL2 by expanding or contracting each of the link parts 161.

Figure 11:
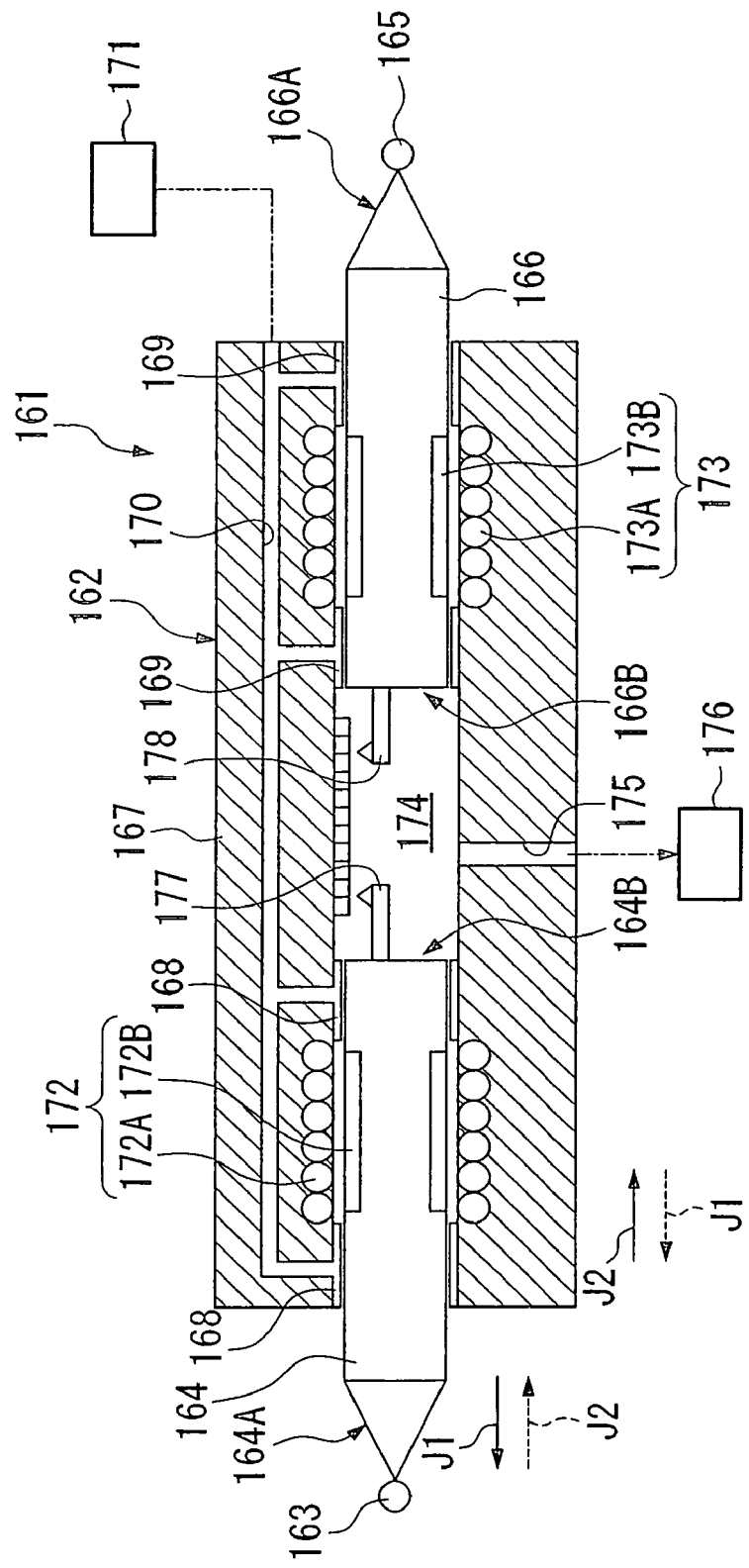
FIG. 11 is a cross sectional view of a link part that constitutes the coupling apparatus.

FIG. 11 is a cross sectional view of the link part 161.

In FIG. 11, the link part 161 includes the tubular member 167, and the first and second linking members 164, 166, which are shaft shaped members provided movable (retractable) with respect to the tubular member 167. The spherical bearings 163, 165 are provided respectively at tip parts 164A, 166A of the first and second linking members 164, 166. Gas bearings (air bearings) 168, 169, which are non-contact bearings, are disposed respectively between the tubular member 167 and the first and second linking members 164, 166. Furthermore, other systems of bearings that use magnetism and the like can also be used as the non-contact bearings. Two air bearings 168 are provided arranged in a row in the axial direction at a position opposing the first linking member 164 on the inner surface of the tubular member 167. Likewise, two air bearings 169 are provided lined up in the axial direction at a position opposing the second linking member 166 on the inner surface of the tubular member 167. These air bearings 168, 169 are tubularly provided along the inner surface of the tubular member 167. A gas supply source 171 supplies compressed gas (air) to the air bearings 168, 169 via a passageway 170 formed inside the tubular member 167. The first and second linking members 164, 166 are supported by the air bearings 168, 169 in a non-contact manner with respect to the tubular member 167.

A first voice coil motor 172 is disposed between the first linking member 164 and the tubular member 167 as a drive mechanism that drives the first linking member 164. In the present embodiment, a coil 172A is provided along the inner surface of the tubular member 167 and a magnet 172B is provided along an outer circumferential surface of the first linking member 164, both constituting the first voice coil motor 172. Furthermore, driving the first voice coil motor 172 generates Lorentz's force, and the first linking member 164 supported by the tubular member 167 in a non-contact manner is movable in the axial direction thereof.

Likewise, a second voice coil motor 173 is disposed between the second linking member 166 and the tubular member 167 as a drive mechanism that drives the second linking member 166. A coil 173A is provided along the inner surface of the tubular member 167 and a magnet 173B is provided along the outer circumferential surface of the second linking member 166, both constituting the second voice coil motor 173. Furthermore, driving the second voice coil motor 173 generates Lorentz's force, and the second linking member 166 supported by the tubular member 167 in a non-contact manner is movable in the axial direction thereof.

The link part 161 uses Lorentz's force produced by the voice coil motors 172, 173 to move the first and second linking members 164, 166, and the distance between the tip part 164A of the first linking member 164 and the tip part 166A of the second linking member 166 can thereby be changed. In other words, the link part 161 is expandable and contractible.

The first linking member 164 and the second linking member 166 are linked in a non-contact manner, and a space 174 therebetween is connected to a vacuum apparatus 176 via a passageway 175 formed in the tubular member 167.

By driving the vacuum apparatus 176, a negative pressure is applied to the space 174. Thereby, in a state wherein the lens cell LS2 is linked to the first linking member 164 and the lens barrel base plate 108 is linked to the second linking member 166, even if the first linking member 164 receives a force, such as the weight of the lens cell LS2 and its own weight of the first linking member 164, in a direction away from the second linking member 166, a counterforce acts to pull together the first linking member 164 and second linking member 166 which are linked in a non-contact manner. Furthermore, if the lens cell LS2 is held with the projection optical system PL2 turned upside down, then a positive pressure may be applied to the space 174 between the first linking member 164 and the second linking member 166.

A first encoder 177, which is a position measuring apparatus that measures the position information of the first linking member 164 with respect to the tubular member 167, is provided at a predetermined position disposed at a rear end part 164B of the first linking member 164, i.e., at the space 174 of the first linking member 164. Likewise, a second encoder 178, which is a position measuring apparatus that measures the position information of the second linking member 166 with respect to the tubular member 167, is provided at a predetermined position disposed at the rear end part 166B of the second linking member 166, i.e., at the space 174 of the second linking member 166. The measurement result of each of the first and second encoders 177, 178 is outputted to the control apparatus CONT2. Further, because the relative position information between the first linking member 164 and the tubular member 167 is measured by the first encoder 177, and the relative position information between the second linking member 166 and the tubular member 167 is measured by the second encoder 178, the control apparatus CONT2 can obtain the position information of the first linking member 164 with respect to the second linking member 166 based on the measurement results of these first and second encoders 177, 178. The first linking member 164 is linked to the lens cell LS2 that holds the lens element 102, and the second linking member 166 is linked to the lens barrel base plate 108 that supports the lens barrel PK2 that holds the optical group MPL2. Accordingly, by obtaining the position information of the first linking member 164 with respect to the second linking member 166, the control apparatus CONT2 can substantially obtain the position information of the lens cell LS2 (the lens element 102) with respect to the lens barrel base plate 108 (the optical group MPL2).

Further, based on the measurement results of the first and second encoders 177, 178 provided in each of the six link parts 161, the control apparatus CONT2 obtains the attitude information of the lens cell LS2 (lens element 102) with respect to the lens barrel base plate 108 (optical group MPL2).

When expanding and contracting each of the link parts 161 in the present embodiment (when changing the distance between the tip part 164A of the first linking member 164 and the tip part 166A of the second linking member 166), only the first voice coil motor 172 is driven, and the second voice coil motor 173 is not driven. Further, because the air bearing 168 supports the first linking member 164 in a non-contact manner with respect to the tubular member 167, when driving the voice coil motor 172 in order to change the distance between the tip part 164A of the first linking member 164 and the tip part 166A of the second linking member 166, the tubular member 167 moves in a direction the opposite of the movement direction of the first linking member 164 by just the amount of that applied drive impulse divided by the mass of the tubular member 167. This movement of the tubular member 167 offsets the reaction force which is generated with the drive of the voice coil motor 172 in order to move the first linking member 164, or in order to maintain the attitude of the first linking member 164 after the movement. In other words, this tubular member 167 functions as a so-called counter mass. The action of the tubular member 167 as a counter mass absorbs the vibrations produced by the movement of the lens cell LS2 via the first linking member 164, and those vibrations therefore do not transmit to the lens barrel base plate 108.

In addition, when, for example, a force is applied to the lens cell LS2 by the liquid 101, the voice coil motor 172 drives to maintain the attitude of the lens cell LS2, i.e., so that the first linking member 164 does not move. At this time, the tubular member 167 moves in the direction the reverse of the direction in which the voice coil motor 172 applied a force to the first linking member 164, and the reaction force which is generated with the drive of the voice coil motor 172 is thereby offset. In this case as well, the action of the tubular member 167 absorbs the vibrations produced by the lens cell LS2, and it is therefore possible to prevent the transmission of those vibrations to the lens barrel base plate 108.

The following explains the procedure for using the exposure apparatus EX2 discussed above to expose the pattern of the mask M2 onto the substrate P2.

After the mask M2 is loaded onto the mask stage MST2 and the substrate P2 is loaded onto the substrate stage PST2, the control apparatus CONT2 drives the liquid supply section 111 of the liquid supply mechanism 110, and supplies a predetermined amount of liquid 101 per unit of time onto the substrate P2 via the supply pipe 115 and the supply nozzles 114. In addition, the control apparatus CONT2 drives the liquid recovery section 125 of the liquid recovery mechanism 120 as the liquid supply mechanism 110 supplies the liquid 101, and recovers a predetermined amount of the liquid 101 per unit of time via the recovery nozzles 121 and the recovery pipe 124. Thereby, the immersion area AR2 of the liquid 101 is formed between the lens element 102 of the tip part of the projection optical system PL2 and the substrate P2. Furthermore, the control apparatus CONT2 illuminates the mask M2 with the exposure light EL2 by the illumination optical system IL2, and projects an image of the pattern of the mask M2 onto the substrate P2 via the projection optical system PL2 and the liquid 101.

During a scanning exposure, the pattern image of part of the mask M2 is projected onto the projection area AR1, and the substrate P2 moves in the +X direction (or −X direction) at a speed β·V (where β is the projection magnification) via the substrate stage PST2 synchronized to the movement of the mask M2 at the speed V in the −X direction (or +X direction) with respect to the projection optical system PL2. Further, after the exposure of one shot region is completed, the next shot region moves to the scanning start position by the stepping of the substrate P2, and the exposure process is successively performed subsequently for each shot region by the step-and-scan system. In the present embodiment, the liquid 101 is flowed in a direction parallel to and identical to the movement direction of the substrate P2. In other words, if the scanning exposure is performed by moving the substrate P2 in the scanning direction (the −X direction) depicted by an arrow Xa2 (refer to FIG. 9), then the liquid supply mechanism 110 and the liquid recovery mechanism 120 use the supply pipe 115, the supply nozzles 114A-114C, the recovery pipe 124, and the recovery nozzles 121A, 121B to supply and recover the liquid 101. In other words, when the substrate P moves in the −X direction, the supply nozzles 114 (114A-114C) supply the liquid 101 between the projection optical system PL2 and the substrate P2, the recovery nozzles 121 (121A, 121B) recover the liquid 101 on the substrate P2, and the liquid 101 thereby flows in the −X direction so that it fills between the lens element 102 at the tip portion of the projection optical system PL2 and the substrate P2. On the other hand, if the scanning exposure is performed by moving the substrate P2 in the scanning direction (the +X direction) depicted by an arrow Xb2 (refer to FIG. 9), then the liquid supply mechanism 110 and the liquid recovery mechanism 120 use the supply pipe 115', the supply nozzles 114A'-114C', the recovery pipe 124', and the recovery nozzles 121A', 121B' to supply and recover the liquid 101. In other words, when the substrate P moves in the +X direction, the supply nozzles 114' (114A'-114C') supply the liquid 101 between the projection optical system PL2 and the substrate P2, the recovery nozzles 121' (121A', 121B') recover the liquid 101, and the surrounding gas, on the substrate P2, and the liquid 101 thereby flows in the +X direction so that it fills between the lens element 102 at the tip portion of the projection optical system PL2 and the substrate P2. In this case, the liquid 101 can be easily supplied between the lens element 102 and the substrate P2, even if the supplied energy of the liquid supply mechanism 110 (liquid supply part 111) is small, because the liquid 101 supplied, for example, via the supply nozzles 114, flows so that it is drawn between the lens element 102 and the substrate P2 as the substrate P2 moves in the −X direction. Further, even if the substrate P2 is scanned in either the +X direction or the −X direction by switching the direction in which the liquid 101 flows in accordance with the scanning direction, the liquid 101 can be filled between the lens element 102 and the substrate P2, and a high resolution and large depth of focus can thereby be obtained.

Here, the vibration component produced by the substrate P2 side due to the movement of the substrate stage PST2 in the XY direction to perform scanning and exposure, and/or due to the movement in the Z axial direction and the inclined directions (θX, θY directions) to perform focus-leveling adjustment, may be transmitted to the lens element 102 via the liquid 101 of the immersion area AR2. In addition, it is also conceivable that the viscous resistance of the liquid 101 in the immersion area AR2 may move the lens element 102 when scanning the substrate P2. In that case, there is a possibility that the pattern image projected onto the substrate P2 via the projection optical system PL2 and the liquid 101 will unfortunately degrade.

Incidentally, because the lens element 102, which contacts the liquid 101, and the optical group MPL2 are isolated and held by the lens cell LS2 and the lens barrel PK2, respectively, the lens element 102 and the optical group MPL2 can be vibrationally isolated. Accordingly, it is possible to suppress the transmission to the optical group MPL2 of vibrations transmitted to the lens element 102.

When vibrations act upon the lens element 102, the lens element 102 moves, and changes its relative position with the optical group MPL2, and there is consequently a possibility of inviting degradation of the pattern image therewith. At this time, the control apparatus CONT2 obtains the attitude information of the lens element 102 with respect to the optical group MPL2 based on the measurement results of the first and second encoders 177, 178 provided in each of the link parts 161 that constitute the coupling apparatus 160.

The control apparatus CONT2 can maintain in a desired state the position (attitude) of the lens element 102 with respect to the optical group MPL2 by driving the first voice coil motor 172 of each of the link parts 161 based on the obtained attitude information. In other words, the control apparatus CONT2 performs feedback control wherein the first voice coil motor 172 is driven to maintain in a desired state the attitude of the lens element 102 with respect to the optical group MPL2 based on the measurement results of the first and second encoders 177, 178. Thereby, even if vibrations act upon the lens element 102, the lens element 102 moves, and thereby the relative position with respect to the optical group MPL2 is made to change, the positional relationship between the optical group MPL2 and the lens element 102 can be constantly maintained, and it is therefore possible to ensure that vibrations of the lens element 102 do not transmit to the optical group MPL2.

At this time, the control apparatus CONT2 obtains the position information of the lens element 102 with respect to the optical group MPL2 in each of the X axial, Y axial, Z axial, θX, θY and θZ directions by performing arithmetic processing based on the measurement results of the encoders 177, 178 provided in each of the six link parts 161. In addition, the control apparatus CONT2 controls the position of the lens element 102 with respect to the optical group MPL2 in each of the X axial, Y axial, Z axial, θX, θY and θZ directions by expanding and contracting each of the six link parts 161.

Furthermore, because vibrations produced when driving the first voice coil motor 172 are absorbed by the action of the tubular member 167 as a counter mass, which is a vibration isolating mechanism built in the link part 161, it is possible to ensure that the vibrations are not transmitted to the optical group MPL2 via the lens barrel base plate 108 and the lens barrel PK2. Accordingly, it is possible to prevent degradation of the pattern image projected onto the substrate P2.

In addition, by preventing the transmission of the vibrations to the optical group MPL2 and to the lens barrel PK2 that holds the optical group MPL2, the measurement of the position information of the substrate stage PST2 and the control of its position based on those measurement results can be performed with good accuracy, even if the reference mirror (fixed mirror) 181 of the interferometer system for measuring the position information of the substrate stage PST2 is affixed to the lens barrel PK2.

In the present embodiment, when each link part 161 is expanded and contracted, and the attitude of the lens element 102 held by the lens cell LS2 is controlled, only the first voice coil motor 172 is driven, and the second voice coil motor 173 is not driven, as discussed above. In other words, when controlling the attitude of the lens element 102, electric power for its control is supplied only to the first voice coil motor 172, and hardly any (or no) electric power is supplied to the second voice coil motor 173. Furthermore, when moving the first voice coil motor 172 for controlling the attitude of the lens element 102, for example, toward the arrow J1 side in FIG. 11, then the tubular member 167 moves toward the arrow J2 side. At this time, the second linking member 166 linked to the lens barrel base plate 108 does not move. Depending on the scanning exposure conditions, there is a possibility that the tubular member 167 will continue to move only in, for example, the arrow J2 direction. In that case, there is a possibility that the first linking member 164 will disconnect from the tubular member 167 if the relative position gap between the tubular member 167 and the first and second linking members 164, 166 increases. Therefore, when the relative position between the tubular member 167 and the first and second linking members 164, 166 exceeds a permissible value, the control apparatus CONT2 corrects the position of the tubular member 167 by driving the second voice coil motor 173. Furthermore, the second voice coil motor 173 may be driven with a timing other than the exposure operation, such as, for example, during replacement of the substrate, and/or the time from after the exposure of the first shot region until before the exposure of the next second shot region. Furthermore, when the attitude of the lens element 102 (the lens cell LS2) is controlled by the first voice coil motor 172 during exposure, the vacuum apparatus 176 maintains the space 174 at a constant pressure.

In the present embodiment, by negatively pressurizing the space 174 between the first linking member 164 and the second linking member 166, the relative position (distance) between the first linking member 164 and second linking member 166 which are linked in a non-contact manner is maintained, even if the first linking member 164 receives a force, due to, for example, the weight of the lens cell LS2 and its own weight of the first linking member 164, in a direction away from the second linking member 166. Further, by continuing to supply electric power to the voice coil motors 172, 173, it is also possible that they will be subject to the weight of the lens cell LS2 and its own weight of the first linking member 164; in that case, there is a possibility that the amount of electric power supplied to the voice coil motors will increase, and it cause the generation of heat. Because the link parts 161 are disposed in the vicinity of the image plane of the projection optical system PL2, there is a possibility that the generation of heat will cause degradation of the pattern image projected onto the substrate P2.

Furthermore, because the weight of the lens cell LS2 and its own weight of the first linking member 164 are supported by applying a negative pressure to the space 174, the electric power supplied to the voice coil motors may be just the electric power for controlling the attitude of the lens cell LS2 (the lens element 102). Accordingly, the amount of electric power supplied to the voice coil motors can be curbed, and the problems associated with the generation of heat can be suppressed.

Furthermore, a temperature regulator may be provided for adjusting the temperature of (for cooling) these voice coil motors 172, 173 in order to suppress the impact on the pattern image due to the generation of heat by the voice coil motors 172, 173.

By providing the space 174, the elastic action of the gas of that space 174 can reduce the high frequency component of the vibrations that attempt to transmit from the lens cell LS2 side to the lens barrel base plate 108 side.

Furthermore, because the relatively low frequency component of the vibrations is reduced by the voice coil motors, the link parts 161 (the coupling apparatus 160) can achieve the affect of eliminating the vibrations over a broad frequency band. Thus, by combining active vibration isolation (dynamic vibration isolation) using the voice coil motors with passive vibration isolation (passive vibration isolation) using the elastic action of the gas of the space 174, it is possible to effectively suppress the transmission to the optical group MPL2 of the vibrations that act upon the lens element 102.

Furthermore, instead of a constitution wherein the weight of the lens cell LS2 and its own weight of the first linking member 164 are received by the space 174 negatively pressurized, the first linking member 164 and the second linking member 166 may be linked by, for example, a spring member.

Furthermore, in the present embodiment, the lens cell LS2 is constituted so that it holds only one lens element 102, but may be constituted so that it holds a plurality of lens elements (optical elements).

In addition, in the exposure apparatus of the second embodiment as well, the projection optical system PL2 is divided into two groups: the optical element 102, and the projection optical system main body MPL2 between the mask M2 and the optical element 102; however, it may be divided into three or more groups.

Furthermore, in the abovementioned embodiment, the second linking member 166 of the link part 161 is linked to the lens barrel base plate 108, but may be linked to another member, e.g., the column 103 (the lower side step part 103B).

Furthermore, in the abovementioned embodiment, the attitude control (the control of the active vibration isolation from the optical group MPL2) of the lens element 102 is accomplished by feedback control based on the result of measuring the position of the lens element 102 by the encoders 177, 178; however, in that case, there is the possibility of control delays. Therefore, it is also possible to perform active vibration isolation with feedforward control, wherein, physical quantities related to the behavior of the exposure apparatus EX2 and/or the liquid 101 during scanning exposure are obtained prior to performing the exposure, and the attitude of the lens element 102 is controlled by driving the link part 161 (voice coil motor 172) during the exposure based on those obtained physical quantities. Furthermore, it is also possible to combine feedback control and feedforward control.

If performing feedforward control, then a test exposure is performed beforehand and a plurality of physical quantities are obtained. Namely, an identification test is performed on the system of the exposure apparatus EX2, and the dynamic characteristics, including the physical quantities of that system, are obtained. In the identification test, the substrate stage PST2 is scanned in a state wherein the immersion area AR2 is formed between the lens element 102 and the substrate P2 using the liquid supply mechanism 110 and the liquid recovery mechanism 120, and the physical quantities are detected using the abovementioned encoders 177, 178 and/or the laser interferometer 182. Furthermore, the voice coil motors 172, 173 are, of course, not driven during the identification test. The detected physical quantities include: the time during the exposure sequence; the position, speed, and acceleration of the substrate P2; the position, speed, and acceleration of the lens element 102; the relative position, the relative speed, and the relative acceleration between the lens element 102 and the substrate P2; and the like. The position, speed, and acceleration values are detected for all X axial, Y axial, Z axial, θX, θY and θZ directions (six degrees of freedom). Furthermore, the detected physical quantities include the amount (volume and mass), for example, of the liquid 1 to be supplied. The plurality of physical quantities detected by the identification test are stored in the control apparatus CONT2. Based on the detected physical quantities, the control apparatus CONT2 determines the control quantities (electric power for control) for driving the voice coil motors 172 (173), and performs the exposure while driving the voice coil motor 172 based on those determined physical quantities so that it vibrationally isolates the optical group MPL2. Thus, the control apparatus CONT2 can use the voice coil motor 172 to perform vibration isolation in accordance with the dynamic characteristics (operation) of the exposure apparatus EX2 itself, and can maintain the positional relationship between the optical group MPL2 and the lens element 102 in the desired state.

Incidentally, as discussed above, the control apparatus CONT2 can control the attitude of the lens element 102 by expanding and contracting each of the plurality of link parts 161. Therefore, by actively controlling the attitude of the lens element 102 with respect to the optical group MPL2 by expanding and contracting the link parts 161, the control apparatus CONT2 can adjust the pattern image to be formed on the substrate P2 via the projection optical system PL2. Furthermore, by driving the lens element 102, at least one of the image plane, the image position, and the distortion can be controlled. By employing the constitution wherein the pattern image is adjusted by driving the lens element 102, a high speed response can be achieved compared to the constitution wherein the heavy substrate stage PST2 is driven, because the relatively lightweight lens element 102 is driven, for example, when aligning the image plane of the projection optical system PL2 to the surface of the substrate P2. Of course, in that case, both the substrate stage PST2 and the lens element 102 may be driven.

Figure 12:
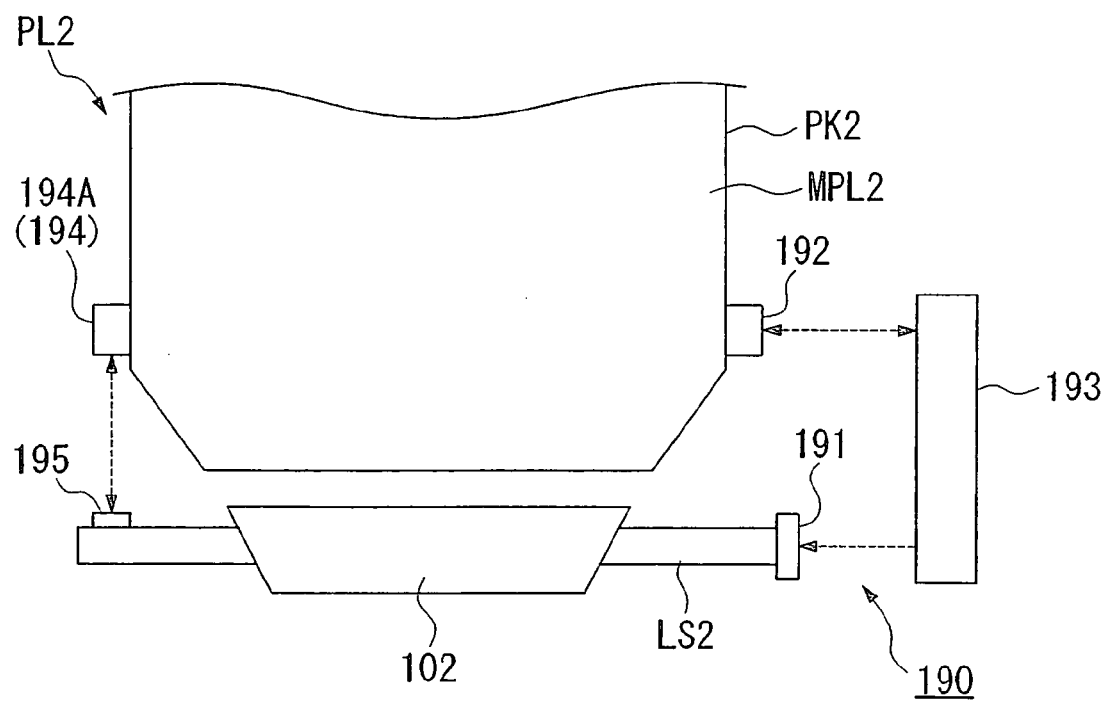
FIG. 12 is a schematic block diagram showing a measuring means that measures the position information of the first group.

The abovementioned embodiment is constituted to obtain the attitude of the lens element 102 based on the measurement results of the encoders 177, 178 provided in each of the six link parts 161. In this case, because the control apparatus CONT2 obtains the attitude information of the lens element 102 by performing arithmetic processing based on the measurement results of the encoders 177, 178 of the six link parts 161, errors in the position measurement (arithmetic errors) may arise due to errors in the attachment and the installation of the link parts 161, and the like. Therefore, as shown in FIG. 12, the position information of the lens element 102 with respect to the optical group MPL2 may be measured by a measuring apparatus 190 including a laser interferometer system. The control apparatus CONT2 controls the attitude of the lens element 102 by expanding and contracting each of the link parts 161 based on the measurement result of that measuring apparatus 190. Because the position information of the lens element 102 with respect to the optical group MPL2 can be directly derived by the laser interferometer system without going through arithmetic processing, the position information of the lens element 102 can be derived with good accuracy.

In FIG. 12, the measuring apparatus (laser interferometer system) 190 includes a movable mirror 191 provided at a predetermined position on the +X side of the lens cell LS2, a reference mirror (fixed mirror) 192 provided at a predetermined position on the +X side of the lens barrel PK2, and a laser interferometer 193 provided at a position opposing the movable mirror 191 and the reference mirror 192. The laser interferometer 193 irradiates the movable mirror 191 with a measuring beam (measuring light), and irradiates the reference mirror 192 with a reference beam (reference light). The reflected lights respectively from the movable mirror 191 and the reference mirror 192 based on the radiated measuring beam and the reference beam are received by the light receiving portion of the laser interferometer 193, the laser interferometer 193 causes these lights to interfere, and measures the amount of change of the optical path length of the measuring beam using the optical path length of the reference beam as a reference, and consequently measures the position (coordinate) of the movable mirror 191 using the reference mirror 192 as a reference. Because the reference mirror 192 is provided on the lens barrel PK2 and the movable mirror 191 is provided on the lens cell LS2, the laser interferometer 193 can measure the position in the X axial direction of the lens cell LS2 with respect to the lens barrel PK2. Likewise, although not shown, a movable mirror and a reference mirror are also provided on the +Y side of the lens cell LS2 and the lens barrel PK2, a laser interferometer is provided at a position opposing thereto, and this laser interferometer can measure the position in the Y axial direction of the lens cell LS2 with respect to the lens barrel PK2. In addition, the position in the $\theta Z$ direction of the lens cell LS2 with respect to the lens barrel PK2 can be measured by, for example, the laser interferometer 193 irradiating the movable mirror 191 and the reference mirror 192 with at least two beams lined up in a row in the Y axial direction.

Furthermore, laser interferometers 194 (194A-194C) are respectively affixed to the lens barrel PK2 at a plurality of mutually differing predetermined locations (three locations) in the circumferential direction of the lens barrel PK2. However, FIG. 12 representatively depicts just the one laser interferometer 194A of the three laser interferometers 194A-194C. In addition, a movable mirror 195 is affixed at a position opposing each of the laser interferometers 194 on the upper surface of the lens cell LS2, and each movable mirror 195 is irradiated by a measuring beam from each of the laser interferometers 194 parallel to the Z axial direction. Furthermore, the reference mirror corresponding to each laser interferometer 194 is affixed to the lens barrel PK2 or built in the laser interferometer 194, but is not depicted in FIG. 12. The laser interferometer 194 can measure the position in the Z axial direction of the lens cell LS2 with respect to the lens barrel PK2. In addition, the position in the $\theta X$, $\theta Y$ directions of the lens cell LS2 with respect to the lens barrel PK2 can be measured based on the measurement result of each of the three laser interferometers 194.

The measurement result of each of the abovementioned laser interferometers is outputted to the control apparatus CONT2. The control apparatus CONT2 expands and contracts each of the plurality of link parts 161 based on the measurement result of each of the abovementioned laser interferometers, i.e., based on the position information of the lens cell LS2 with respect to the lens barrel PK2 in each of the X axial, Y axial, Z axial, $\theta X$, $\theta Y$ and $\theta Z$ directions, thereby enabling control of the position of the lens cell LS2 with respect to the lens barrel PK2 in each of the X axial, Y axial, Z axial, $\theta X$, $\theta Y$ and $\theta Z$ directions.

Furthermore, in the present embodiment, the measuring apparatus 190 measures the positional relationship between the lens cell LS2 and the lens barrel PK2; however, because the lens cell LS2 holds the lens element 102 and the lens barrel PK2 holds the optical group MPL2, the measurement of the positional relationship between the lens cell LS2 and the lens barrel PK2 and the measurement of the positional relationship between the lens element 102 and the optical group MPL2 are substantially equivalent. Accordingly, the control apparatus CONT2 can obtain the positional relationship between the lens element 102 and the optical group MPL2 based on the measurement result of the measuring apparatus 190.

The laser interferometer in the present embodiment is a so-called double pass interferometer.

Figure 13:
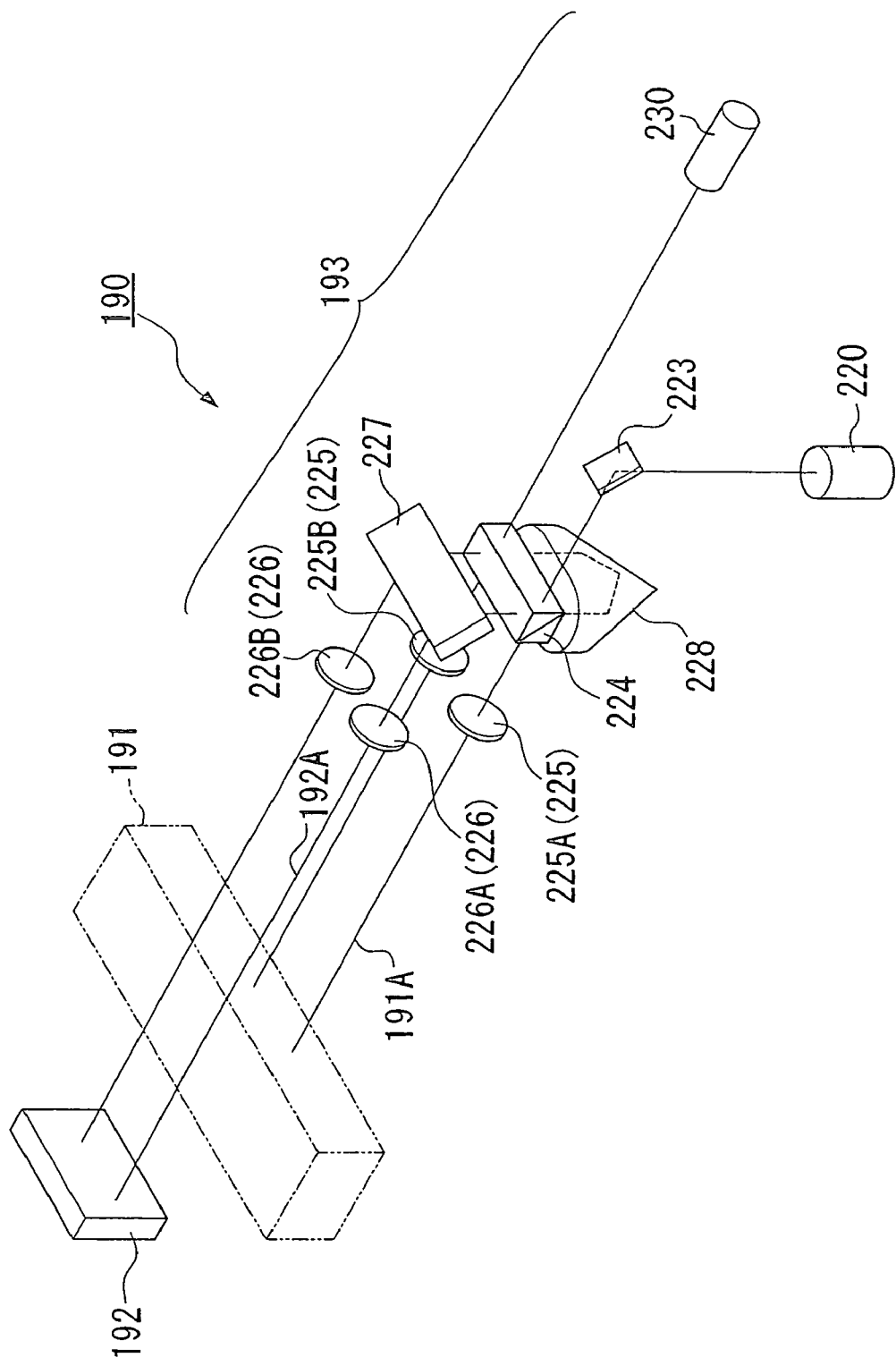
FIG. 13 depicts one example of an interferometer.

FIG. 13 is a schematic block diagram of the interferometer 193. Furthermore, the other interferometers 194, 182 and the like also have a constitution equivalent to the interferometer depicted in FIG. 13. The interferometer 193 includes a light source 220 that radiates a light beam; a polarizing beam splitter 224 that divides the light beam that is irradiated from the light source 220 and enters via a reflecting mirror 223 into a measuring beam 191A and a reference beam 192A; quarter-wave plates 225 (225A, 225B) disposed between the polarizing beam splitter 224 and the movable mirror 191 and through which passes the measuring beam 191A from the polarizing beam splitter 224; quarter-wave plates 226 (226A, 226B) disposed between the polarizing beam splitter 224 and the reference mirror 192 and through which passes the reference beam 192A from the polarizing beam splitter 224 via a reflecting mirror 227; a corner cube 228 to which the measuring beam 191A reflected by the movable mirror 191 and the reference beam 192A reflected by the reference mirror 192 enters via the polarizing beam splitter 224; and a light receiving portion 230 that receives the synthesized light (interference light) of the reflected light of the measuring beam 191A and the reflected light of the reference beam 192A synthesized by the polarizing beam splitter 224.

The light beam that enters the polarizing beam splitter 224 from the light source 220 is divided into the measuring beam 191A and the reference beam 192A. The measuring beam 191A passes through the quarter-wave plate 225A, and then irradiates the movable mirror 191. By passing through the quarter-wave plate 225A, the linearly polarized measuring beam 191A is converted to circularly polarized light, and then irradiates the movable mirror 191. The reflected light of the measuring beam 191A that irradiated the movable mirror 191 once again passes through the quarter-wave plate 225A, then enters the polarizing beam splitter 224 and is sent to the corner cube 228. The measuring beam 191A from the corner cube 228 once again enters the polarizing beam splitter 224, passes through the quarter-wave plate 225B, and then irradiates the movable mirror 191. That reflected light once again passes through the quarter-wave plate 225B, and enters the polarizing beam splitter 224. The reference beam 192A emitted from the polarizing beam splitter 224 passes through the quarter-wave plate 226A via the reflecting mirror 227, and then irradiates the reference mirror 192. The reference beam 192A irradiates the reference mirror 192 with circularly polarized light. The reflected light once again passes through the quarter-wave plate 226A, then enters the polarizing beam splitter 224 and is sent to the corner cube 228. The reference beam 192A from the corner cube 228 once again enters the polarizing beam splitter 224, passes through the quarter-wave plate 226B, and then irradiates the reference mirror 192. The reflected light once again passes through the quarter-wave plate 226B, and then enters the polarizing beam splitter 224. The measuring beam 191A that passed through the quarter-wave plate 225B and the reference beam 192A that passed through the quarter-wave plate 226B are synthesized by the polarizing beam splitter 224, and then received by the light receiving portion 230. Thus, the interferometer 193 of the present embodiment includes a so-called double pass interferometer that twice irradiates a movable mirror (reference mirror) with a measuring beam (reference beam); even if the movable mirror 191 is, for example, inclined, the interferometer 193 has a characteristic in that there is no change in the travel direction of the reflected light of the measuring beam from that movable mirror 191.

FIG. 14 is a schematic view of the double pass interferometer.

FIG. 14 depicts only the measuring beam 191A that irradiates the movable mirror 191, and omits the quarter-wave-plates, and the like.

Figure 15:
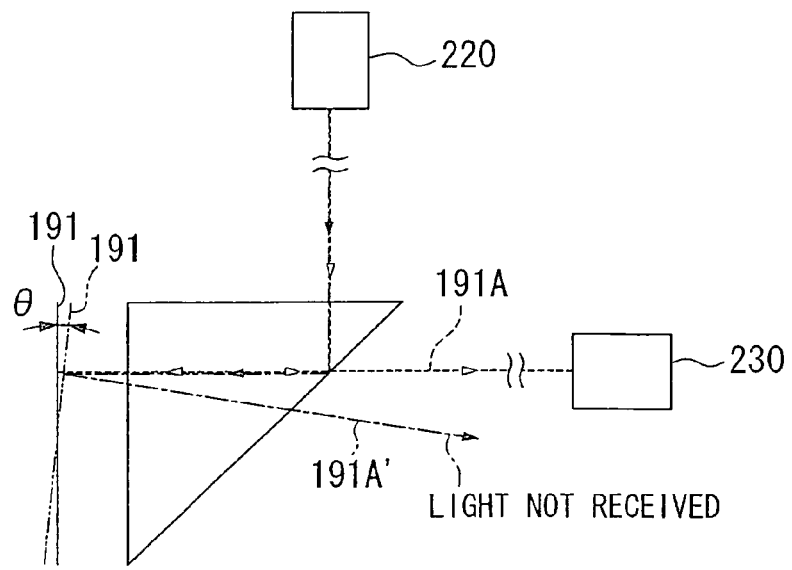
FIG. 15 is a schematic view of the optical path of the interferometer.

In FIG. 14, the light beam emitted from the light source 220 enters the polarizing beam splitter 224 via the reflecting mirror 223. The length measuring beam 191A is reflected by the reflecting surface of the polarizing beam splitter 224, and then irradiates the reflecting surface of the movable mirror 191; after the reflected light twice irradiates the reflecting surface of the movable mirror 191 via the polarizing beam splitter 224 and the corner cube 228, it is received by the light receiving portion 230. At that time, if the reflecting surface of the movable mirror 191 is not inclined (if the angle with the Y axis is 0°), then the measuring beam 191A travels as depicted by the broken line in FIG. 14, and the exit light beam emitted from the polarizing beam splitter 224 towards the light receiving portion 230 becomes parallel to the incident light beam that enters the polarizing beam splitter 224. On the other hand, if the reflecting surface of the movable mirror 191 is inclined at an angle θ, then the measuring beam travels as depicted by the chain line 191A' in FIG. 14. In this case as well, the exit light beam from the polarizing beam splitter 224 becomes parallel to the incident light beam. In other words, the travel directions of each of the exit light beams are the same regardless of whether the reflecting surface of the movable mirror 191 is inclined. Accordingly, if the constitution is such that the measuring beam 191A irradiates the movable mirror 191 one time, as in the schematic view depicted in FIG. 15, then, if the movable mirror 191 is inclined, the travel direction of that reflected light with respect to the uninclined state changes, causing a problem wherein the light is not received by the light receiving portion 230. However, as explained referencing FIG. 14, even if the movable mirror 191 is, for example, inclined, a double pass interferometer can receive that reflected light by the light receiving portion 230.

Figure 16:
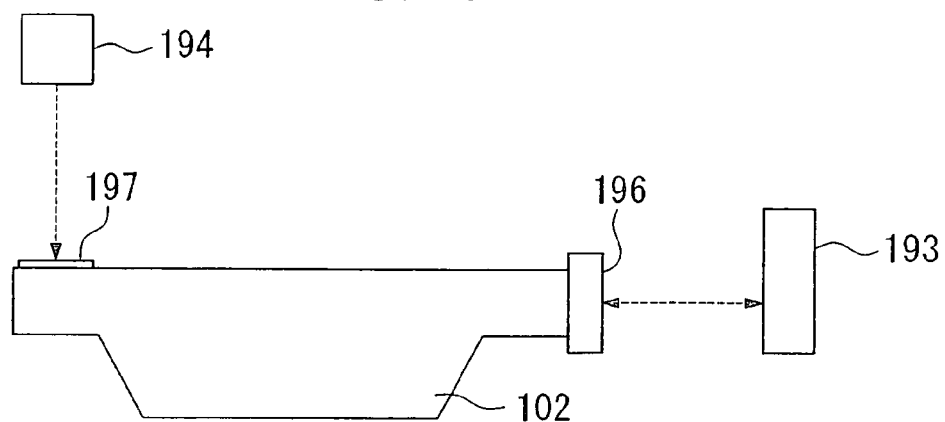
FIG. 16 shows another embodiment of the measuring means that measures the position information of the first group.

Furthermore, in the present embodiment explained referencing FIG. 12, the measuring apparatus 190 including the laser interferometers 193, 194 measures the positional relationship between the lens barrel PK2 and the lens cell LS2; however, a reflecting member having a reflecting surface capable of reflecting the radiated measuring beam may be provided at a predetermined position of the lens element 102, and the laser interferometer may irradiate that reflecting surface with the measuring beam. For example, as depicted in FIG. 16, a mirror member having a reflecting surface may be affixed at a position on the lens element 102 where the measuring beam from the laser interferometer 193 will be irradiated, a vacuum metallized film may be provided at a position where the measuring beam from the laser interferometer 194 will be irradiated, and that film surface may be a reflecting surface. For example, if it is constituted so that a spring mechanism (flexure) is interposed between the lens cell LS2 and the lens element 102, and if the lens cell LS2 and the lens element 102 are temporarily mispositioned, then if an attempt is made to control the attitude of the lens element 102 in order to adjust the pattern image based on the position measurement result of the lens cell LS2, as in the embodiment explained referencing FIG. 12, then there is a possibility that the pattern image cannot be controlled to achieve the desired state; however, the position information of the lens element 102 can be accurately derived by forming the reflecting surface on the lens element 102 itself and measuring the position of the lens element 102 using that reflecting surface, as depicted in FIG. 16.

Furthermore, in the present embodiment discussed above, an interferometer system is used as the measuring apparatus 190, but a measuring apparatus that employs another system may be used. For example, instead of the interferometer system discussed above, it is possible to use a measuring apparatus that optically measures the position information of a measurement mark formed on the lens cell LS2.

In addition, because the coupling apparatus 160 can move the lens element 102, it is possible to form the immersion area AR2 between the lens element 102 and the substrate P2 by sufficiently enlarging the distance between the substrate P2 and the lens element 102 by pre-raising the lens element 102 using the coupling apparatus 160, disposing the liquid on the substrate P2, and subsequently driving the coupling apparatus 160 to lower the lens element 102 and bring the lens element 102 proximate to the substrate P2, when, for example, filling the liquid 101 between the lens element 102 and the substrate P2. In this case, when lowering the lens element 102, by bringing the lens element 102 proximate (lowering) to the substrate P2 from the inclined direction, it is possible to remove any bubbles that may exist, for example, in the liquid 101. In addition, when supplying the liquid 101 onto the substrate P2 prior to exposure, it is possible to dispose the liquid 101 onto the substrate P2 using, for example, a liquid supply apparatus provided at a position separate from the liquid supply mechanism 110, without using the liquid supply mechanism 110.

The above embodiments are not particularly limited to the nozzle configurations discussed above, e.g., the liquid 101 may be supplied and recovered by two pairs of nozzles on the long sides of the projection area AR1. Furthermore, in this case, the supply nozzles and the recovery nozzles may be disposed so that they are arrayed vertically in order to enable the supply and recovery of the liquid 101 from either the +X direction or the −X direction.

In addition, in the embodiments discussed above, the two object coupling apparatus used in the parallel link mechanism is used to support the lens cell LS2, but the embodiments are not limited thereto, and the coupling apparatus may be used, for example, to support the substrate holder PH2.

As discussed above, the liquids 50, 101 in the above embodiments include pure water. Pure water is advantageous because it can be easily obtained in large quantities at a semiconductor fabrication plant, and the like, and because pure water has no adverse impact on the optical elements (lenses), the photoresist on the substrates P, P2, and the like. In addition, because pure water has no adverse impact on the environment and has an extremely low impurity content, it can also be expected to have the effect of cleaning the surfaces of the substrates P, P2, and the surfaces of the optical element provided on the tip surfaces of the projection optical systems PL, PL2.

Further, because the refractive index n of pure water (water) for the exposure lights EL, EL2 having a wavelength of approximately 193 nm is substantially 1.44, the use of ArF excimer laser light (193 nm wavelength) as the light sources of the exposure lights EL, EL2 would shorten the wavelength on the substrates P, P2 to 1/n, i.e., approximately 134 nm, thereby obtaining a high resolution. Furthermore, because the depth of focus will increase approximately n times, i.e., approximately 1.44 times, that of in air, the numerical aperture of the projection optical systems PL, PL2 can be further increased if it is preferable to ensure a depth of focus approximately the same as that when used in air, and the resolution is also improved from this standpoint.

In the present embodiment, the lenses 60, 102 are affixed at the tip of the projection optical systems PL, PL2. As an optical element that is affixed at the tip of the projection optical systems PL, PL2, it may be an optical plate used to adjust the optical characteristics, e.g., aberrations (spherical aberration, coma aberration, and the like), of the projection optical systems PL, PL2. Alternatively, it may be a plane parallel plate capable of transmitting the exposure light EL therethrough.

Furthermore, although the liquids 50, 101 in the above embodiments are water, they may be a liquid other than water; for example, if the light sources of the exposure lights EL, EL2 are $F_2$ lasers, then the $F_2$ laser light will not transmit through water, so it would be acceptable to use as the liquids 50, 101 a fluorine based liquid, such as perfluorinated polyether (PFPE) or fluorine based oil, that is capable of transmitting $F_2$ laser light. In addition, it is also possible to use one as the liquids 50, 101 (e.g., cedar oil) that is transparent to the exposure lights EL, EL2, has the highest possible refractive index, and is stable with respect to the projection optical systems PL, PL2 and the photoresist coated on the surfaces of the substrates P, P2.

Furthermore, the substrates P, P2 in each of the abovementioned embodiments is not limited to a semiconductor wafer for fabricating semiconductor devices, and is also applicable to a glass substrate for a display device, a ceramic wafer for a thin film magnetic head, or a mask or original plate of a reticle (synthetic quartz, silicon wafer) used by an exposure apparatus, and the like.

In addition, in the embodiments discussed above, an exposure apparatus is used that locally fills liquid between the projection optical systems PL, PL2 and the substrates P, P2, but the present invention is also applicable to a liquid immersion exposure apparatus that moves a stage, which holds the substrate to be exposed, in a liquid bath, as disclosed in Japanese Unexamined Patent Application, First Publication No. H06-124873, as well as to a liquid immersion exposure apparatus that forms a liquid bath having a predetermined depth on the stage, and holds the substrate therein, as disclosed in Japanese Unexamined Patent Application, First Publication No. H 10-303114.

In addition to a step-and-scan system scanning type exposure apparatus (scanning stepper) that scans and exposes the patterns of the masks M, M2 while synchronously moving the masks M, M2 and the substrates P, P2, a step-and-repeat system projection exposure apparatus (stepper) that exposes the full patterns of the masks M, M2 with the masks M, M2 and the substrates P, P2 in a stationary state and sequentially steps the substrates P1, P2 is also applicable to the exposure apparatuses EX, EX2. In addition, the present invention is also applicable to a step-and-stitch system exposure apparatus that partially and superimposingly transfers at least two patterns onto the substrates P, P2.

In addition, the present invention is also applicable to twin stage type exposure apparatuses that include two stages where substrates to be processed, e.g., wafers, are mounted separately, and that can move those substrates independently in the XY directions. The structure and the exposure operation of a twin stage type exposure apparatus is disclosed in, for example, Japanese Unexamined Patent Application, First Publication No. H10-163099 and Japanese Unexamined Patent Application, First Publication No. H10-214783 (corresponding U.S. Pat. Nos. 6,341,007; 6,400,441; 6,549,269; and 6,590,634); Published Japanese translation No. 2000-505958 of PCT International Publication (corresponding U.S. Pat. No. 5,969,441); or U.S. Pat. No. 6,208,407; and the contents thereof are hereby incorporated by reference in their entireties to the extent permitted by the laws and regulations of the states designated or elected by the present international patent application.

The types of exposure apparatuses EX, EX2 are not limited to semiconductor device fabrication exposure apparatuses that expose the pattern of a semiconductor device on the substrates P, P2, but is also widely applicable to exposure apparatuses for fabricating liquid crystal devices or displays, exposure apparatuses for fabricating thin film magnetic heads, imaging devices (CCD), reticles and masks, and the like.

If a linear motor is used in the substrate stage PST and/or the mask stage MST, then either an air levitation type that uses an air bearing or a magnetic levitation type that uses Lorentz's force or reactance force may be used. In addition, each of the stages PST, MST may be a type that moves along a guide, or may be a guideless type not provided with a guide. An example of using a linear motor in a stage is disclosed in U.S. Pat. Nos. 5,623,853 and 5,528,118, and the contents thereof are hereby incorporated by reference in their entireties to the extent permitted by the laws and regulations of the states designated or elected by the present international patent application.

For the drive mechanism of each of the stages PST, PST2, MST, MST2, a planar motor may be used that disposes a magnet unit, wherein magnets are arranged two dimensionally, opposing an armature unit, wherein coils are arranged two dimensionally, and drives each of the stages PST, PST2, MST, MST2 by electromagnetic force. In this case, any one among the magnet unit and the armature unit is connected to the stages PST, PST2, MST, MST2, and the other one of the magnet unit and the armature unit should be provided on the moving surface side of the stages PST, PST2, MST, MST2.

The reaction force generated by the movement of the substrate stage PST may be mechanically discharged to the floor (ground) using a frame member so that it is not transmitted to the projection optical system PL. A method of handling this reaction force is disclosed in detail in, for example, U.S. Pat. No. 5,528,118 (Japanese Unexamined Patent Application, First Publication No. H08-166475), and the contents thereof are hereby incorporated by reference in their entireties to the extent permitted by the laws and regulations of the states designated or elected by the present international patent application.

The reaction force generated by the movement of the mask stage MST may be mechanically discharged to the floor (ground) using a frame member so that it is not transmitted to the projection optical system PL. A method of handling this reaction force is disclosed in detail in, for example, U.S. Pat. No. 5,874,820 (Japanese Unexamined Patent Application, First Publication No. H08-330224), and the contents thereof are hereby incorporated by reference in their entireties to the extent permitted by the laws and regulations of the states designated or elected by the present international patent application.

The exposure apparatuses EX, EX2 of the embodiments are manufactured by assembling various subsystems, including each constituent element recited in the claims of the present application, so that a predetermined mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems.

The assembly process, from the various subsystems to the exposure apparatus includes the mutual mechanical connection of the various subsystems, the wiring and connection of electrical circuits, the piping and connection of the atmospheric pressure circuit, and the like. Naturally, before the process of assembling from these various subsystems to the exposure apparatus, there are processes for assembling each of the individual subsystems. When the assembly process ranging from various subsystems to the exposure apparatus has been completed, a comprehensive adjustment is performed to ensure the various accuracies of the exposure apparatus as a whole. Furthermore, it is preferable to manufacture the exposure apparatus in a clean room where the temperature, the cleanliness level, and the like, are controlled.

Figure 17:
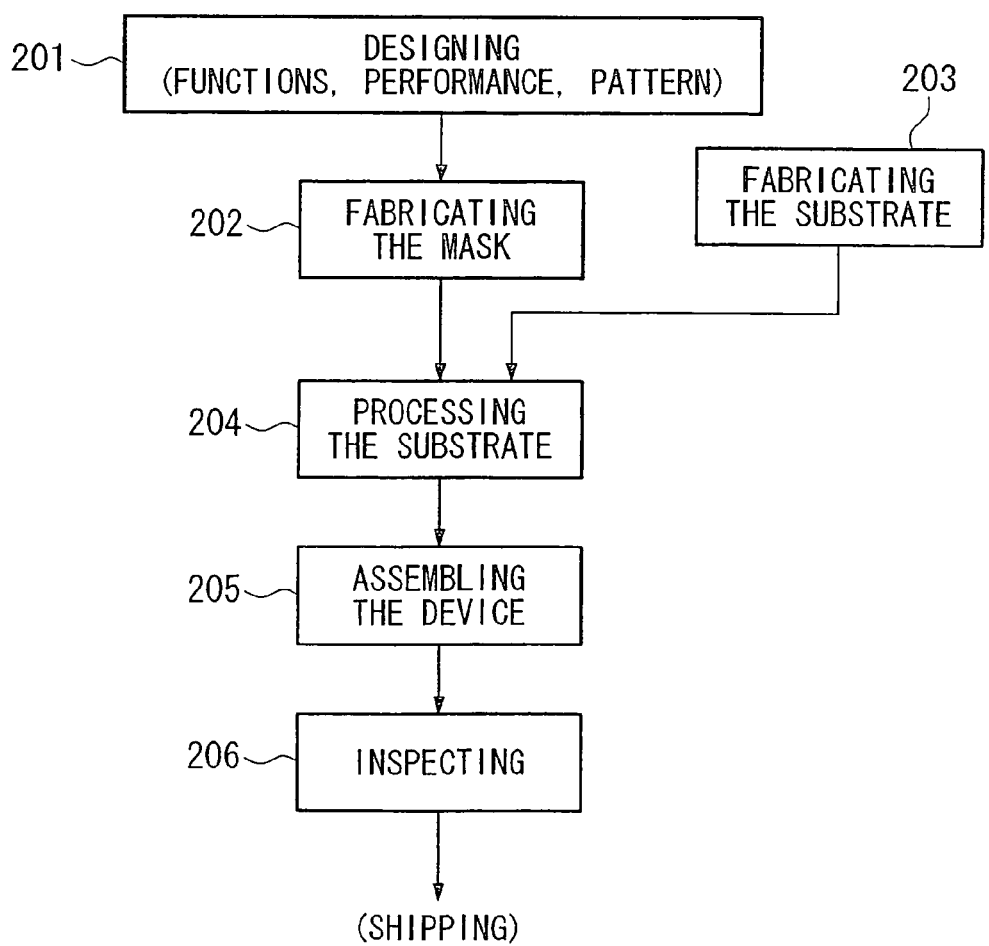
FIG. 17 is a flow chart showing one example of the processes for manufacturing a semiconductor device.

As shown in FIG. 17, a micro-device, such as a semiconductor device, is manufactured by: a step 201 that designs the functions and performance of the micro-device; a step 202 that fabricates a mask (reticle) based on this design step; a step 203 that fabricates a substrate, which is the base material of the device; a substrate processing step 204 wherein the exposure apparatus EX of the embodiments discussed above exposes a pattern of the mask onto the substrate; a device assembling step 205 (including a dicing process, a bonding process, and a packaging process); a scanning step 206; and the like.

The present invention is an exposure apparatus that exposes a substrate by filling a liquid between a projection optical system and a substrate and then projecting a pattern image onto the substrate via the projection optical system and the liquid, wherein the projection optical system includes a first group having an optical member that contacts the liquid, and a second group different from the first group; and, because that first group and second group are supported vibrationally isolated, degradation of the pattern image can be suppressed and a high precision device can be manufactured, even in the state wherein the liquid is filled between the projection optical system and the substrate.

What is claimed is:

1. An exposure apparatus comprising:
   a projection optical system that has a first group including an optical member that contacts a liquid, and a second group that differs from the first group;
   a substrate stage that is movable with respect to the optical member while the optical member contacts the liquid;
   a support mechanism that supports the first group and the second group so that the first group and the second group are substantially isolated from each other; and
   a drive mechanism that adjusts a position of the first group so that a predetermined relationship between the first group and the second group is maintained, the position of the first group being changed due to a pressure change in the liquid.

2. The exposure apparatus according to claim 1, wherein the support mechanism has a first support member that supports the first group, and a second support member that supports the second group and that is different from the first support member.

3. The exposure apparatus according to claim 2, further comprising:
   a first base member that movably and noncontactually supports the substrate stage,
   wherein the first support member is affixed to the first base member.

4. The exposure apparatus according to claim 2, further comprising:
   a first base member that movably and noncontactually supports the substrate stage; and
   a second base member that supports the first base member, wherein first support member is affixed to the second base member.

5. The exposure apparatus according to claim 4, wherein the first base member and the second base member are isolated so that vibrations do not mutually transmit.

6. The exposure apparatus according to claim 2, wherein the first support member noncontactually supports the first group.

7. The exposure apparatus according to claim 1, further comprising:
   a measuring apparatus that measures a positional relationship between the first group and the second group.

8. The exposure apparatus according to claim 7, wherein the drive mechanism drives the first group based on a measurement result of the measuring apparatus.

9. The exposure apparatus according to claim 7, wherein the measuring apparatus has an interferometer system that measures the position of the first group.

10. The exposure apparatus according to claim 9, wherein the support mechanism has a first support member that supports the first group, and
    the interferometer system measures a position of the first support member.

11. The exposure apparatus according to claim 8, wherein the drive mechanism has a voice coil motor.

12. The exposure apparatus according to claim 1, wherein the predetermined relationship comprises a gap between the first group and the second group.

13. The exposure apparatus according to claim 1, further comprising:
a first support member that supports the first group;
a second support member that supports the second group and that is different from the first support member;
a frame member that supports the second support member; and
a linking device that is disposed between the first support member and the frame member and links the first support member and the frame member.

14. The exposure apparatus according to claim 13, wherein the linking device comprises a parallel link mechanism.

15. The exposure apparatus according to claim 13, wherein the linking device comprises a vibration isolating mechanism so that vibrations of one of the first support member and the frame member do not transmit to the other.

16. The exposure apparatus according to claim 15, wherein the vibration isolating mechanism functions dynamically.

17. The exposure apparatus according to claim 15, wherein the vibration isolating mechanism functions passively.

18. The exposure apparatus according to claim 15, wherein the vibration isolating mechanism detects at least one of a plurality of physical quantities and performs vibration isolation based on the detected at least one physical quantity.

19. The exposure apparatus according to claim 15, wherein the vibration isolating mechanism has a counter-mass that absorbs the vibrations of the one of the first support member and the frame member.

20. The exposure apparatus according to claim 19, wherein
the linking device has a first linking member linked to the first support member, and a second linking member linked to the frame member; and
the first and second linking members and the counter-mass are movable relative to a common predetermined direction, and are mechanically guided in a direction that is different from the predetermined direction.

21. The exposure apparatus according to claim 20, wherein an air guide is used to guide in a direction that is different from the predetermined direction.

22. The exposure apparatus according to claim 13, wherein the linking device is capable of expanding and contracting.

23. The exposure apparatus according to claim 1, wherein an immersion area is formed at only a part on the substrate during exposure of the substrate.

24. The exposure apparatus according to claim 1, wherein the optical member comprises a plane parallel plate.

25. The exposure apparatus according to claim 1, wherein the optical member comprises a lens.

26. A device fabricating method that uses the exposure apparatus according to claim 1.

27. An exposure apparatus comprising:
an optical member that contacts a liquid;
a projection optical system body;
a first support member that supports the optical member;
a second support member that supports the projection optical system body;
a frame member that supports the second support member;
a linking device that is disposed between the first support member and the frame member and links the first support member and the frame member; and
a drive mechanism that adjusts a position of the optical member to maintain a predetermined state of a positional relationship between the projection optical system body and the optical member, the position of the optical member being changed due to a pressure change in the liquid.

28. The exposure apparatus according to claim 27, further comprising:
a substrate stage that is movable with respect to the optical member while the optical member contacts the liquid.

29. The exposure apparatus according to claim 27, further comprising:
a measuring apparatus that measures the positional relationship between the optical member and the projection optical system body.

30. The exposure apparatus according to claim 29, wherein the drive mechanism adjusts the position of the optical member based on a measurement result of the measuring apparatus.

31. The exposure apparatus according to claim 29, wherein the measuring apparatus has an interferometer system that measures the position of the optical system.

32. The exposure apparatus according to claim 31, wherein the interferometer system measures a position of the first support member with respect to the second support member.

33. The exposure apparatus according to claim 27, wherein the drive mechanism is provided at the linking device.

34. The exposure apparatus according to claim 33, wherein the drive mechanism has a voice coil motor.

35. The exposure apparatus according to claim 33, wherein the drive mechanism maintains a predetermined state of a gap between the projection optical system body and the optical system.

36. The exposure apparatus according to claim 33, wherein the linking device comprises a vibration isolating mechanism so that vibrations of one of the first support member and the frame member do not transmit to the other.

37. The exposure apparatus according to claim 27, wherein the linking device comprises a vibration isolating mechanism so that vibrations of one of the first support member and the frame member do not transmit to the other.

38. The exposure apparatus according to claim 37, wherein the vibration isolating mechanism functions dynamically.

39. The exposure apparatus according to claim 37, wherein the vibration isolating mechanism functions passively.

40. The exposure apparatus according to claim 37, wherein the vibration isolating mechanism detects at least one of a plurality of physical quantities and performs vibration isolation based on the at least one detected physical quantity.

41. The exposure apparatus according to claim 37, wherein the vibration isolating mechanism has a counter-mass that absorbs the vibrations of the one of the first support member and the frame member.

42. The exposure apparatus according to claim 41, wherein
the linking device has a first linking member linked to the first support member, and a second linking member linked to the frame member; and
the first and second linking members and the counter-mass are movable in a common predetermined direction, and are mechanically guided in a direction that is different from the predetermined direction.

43. The exposure apparatus according to claim 42, wherein an air guide is used to guide in a direction that is different from the predetermined direction.

44. The exposure apparatus according to claim 37, wherein the vibration isolating mechanism is built in the linking device.

45. The exposure apparatus according to claim 44, wherein the linking device comprises a parallel link mechanism having the drive mechanism.

46. The exposure apparatus according to claim 45, wherein the parallel link mechanism is capable of expanding and contracting.

47. The exposure apparatus according to claim 27, wherein an immersion area is formed at only a part on a substrate during exposure of the substrate.

48. The exposure apparatus according to claim 27, wherein the optical member comprises a plane parallel plate.

49. The exposure apparatus according to claim 27, wherein the optical member comprises a lens.

50. A device fabricating method that uses the exposure apparatus according to claim 27.

* * * * *